(12) United States Patent
Tu et al.

(10) Patent No.: US 9,018,655 B2
(45) Date of Patent: Apr. 28, 2015

(54) LIGHT EMITTING APPARATUS AND MANUFACTURE METHOD THEREOF

(71) Applicant: Epistar Corporation, Hsinchu (TW)

(72) Inventors: Chuan-Cheng Tu, Tainan (TW);
Jen-Chau Wu, Hsinchu (TW); Yuh-Ren Shieh, Hsinchu County (TW);
Tzer-Perng Chen, Hsinchu (TW);
Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/082,960

(22) Filed: Nov. 18, 2013

(65) Prior Publication Data

US 2014/0186979 A1 Jul. 3, 2014

Related U.S. Application Data

(63) Continuation-in-part of application No. 11/674,371, filed on Feb. 13, 2007, now abandoned, which is a continuation-in-part of application No. 11/249,680, filed on Oct. 12, 2005, now Pat. No. 7,192,797.

(30) Foreign Application Priority Data

Feb. 3, 2005 (TW) .............................. 94103370 A

(51) Int. Cl.
*H01L 33/62* (2010.01)
*H01L 33/52* (2010.01)
*H01L 33/00* (2010.01)
*H01L 33/22* (2010.01)
*H01L 33/38* (2010.01)

(52) U.S. Cl.
CPC ............ *H01L 33/52* (2013.01); *H01L 33/0079* (2013.01); *H01L 33/22* (2013.01); *H01L 33/38* (2013.01); *H01L 33/0095* (2013.01); *H01L 2924/0002* (2013.01); *H01L 2224/13* (2013.01)

(58) Field of Classification Search
CPC ...... H01L 33/52; H01L 33/0079; H01L 33/22
USPC .......................................................... 257/96
See application file for complete search history.

(56) References Cited

U.S. PATENT DOCUMENTS

| 5,612,231 | A | 3/1997 | Holm et al. |
| 6,649,941 | B2 | 11/2003 | Uemura |
| 6,998,281 | B2 | 2/2006 | Taskar et al. |

(Continued)

FOREIGN PATENT DOCUMENTS

| JP | 2000244012 A | 9/2000 |
| JP | 200317757 A | 1/2003 |

(Continued)

*Primary Examiner* — Ermias Woldegeorgis
(74) *Attorney, Agent, or Firm* — Muncy, Geissler, Olds & Lowe, P.C.

(57) ABSTRACT

The present disclosure provides a method for forming a light-emitting apparatus, comprising providing a first board having a plurality of first metal contacts, providing a substrate, forming a plurality of light-emitting stacks and trenches on the substrate, wherein the light-emitting stacks are apart from each other by the plurality of the trenches, bonding the light-emitting stacks to the first board, forming an encapsulating material commonly on the plurality of the light-emitting stacks, and cutting the first board and the encapsulating material to form a plurality of chip-scale LED units.

20 Claims, 20 Drawing Sheets

(56) References Cited

U.S. PATENT DOCUMENTS

| | | |
|---|---|---|
| 2004/0188696 A1 | 9/2004 | Hsing Chen et al. |
| 2004/0256631 A1 | 12/2004 | Shin |
| 2005/0194605 A1 | 9/2005 | Shelton et al. |
| 2006/0091409 A1* | 5/2006 | Epler et al. .............. 257/95 |
| 2006/0189098 A1* | 8/2006 | Edmond .............. 438/460 |
| 2006/0240585 A1 | 10/2006 | Epler et al. |

FOREIGN PATENT DOCUMENTS

| | | |
|---|---|---|
| JP | 2003-282957 | 10/2003 |
| JP | 2004-055855 | 2/2004 |
| JP | 2005019939 A | 1/2005 |

* cited by examiner

LIGHT EMITTING APPARATUS AND MANUFACTURE METHOD THEREOF

CROSS REFERENCE TO RELATED APPLICATIONS

This application is a continuation-in-part of U.S. patent application Ser. No. 11/674,371, filed Feb. 13, 2007, now abandoned, which is a continuation-in-part of U.S. patent application Ser. No. 11/249,680, filed Oct. 12, 2005, now U.S. Pat. No. 7,192,797, for which priority is claimed under 35 U.S.C. §120, the disclosure of which is incorporated herein by reference in its entirety, and this application claims priority of Application No. 94103370, filed in Taiwan, R.O.C. on Feb. 3, 2005, under 35 U.S.C. §119.

FIELD OF DISCLOSURE

The present disclosure relates to a light emitting device and a method for manufacturing the same. In addition, the present disclosure relates to a light emitting device array and a method for manufacturing the same.

BACKGROUND OF THE DISCLOSURE

For conventional light emitting device (LED) packages, a LED chip is mounted onto the sub-mount using the epoxy put thereon to form a LED element, and the process is called "Die Bonding". Typically, the epoxy used in "Die Bonding" can be silver filled epoxy or other non-conductive resin. Then, the LED elements are assembled onto the circuit board. For a flip-chip LED, the p-type conductive layer and the n-type conductive layer are exposed on the same side to have the positive electrode and the negative electrode on the same side of the LED structure. And the LED structure with the positive electrode and the negative electrode is flipped and disposed on the solder without wire bonding. However, conventional flip-chip LEDs still require "Dicing" and "Die Bonding" for connecting and mounting the circuit board. If the electrodes of flip-chip LEDs have large contact area to be directly connected to the circuit board, a number of conventional packaging processes for LEDs can be skipped.

The operating current of a conventional LED is typically several tens to several hundreds of mAs. Therefore, the brightness of a conventional LED is not suitable for illumination purpose. When lots of LEDs are assembled into a LED lamp to improve the brightness, the volume of the LED lamp increases accordingly and results in the loss of its market competitiveness. Therefore, to improve the brightness of a single LED is a necessary approach. However, as the LED advances towards high brightness, the operating current and power of a single LED become several times to several hundred times than those that a conventional LED requires. For example, the operating current of a high brightness LED is about several hundreds of mAs to several Amps (A). As a result, the heat generated by the LED becomes an important issue. "Heat" seriously affects the performance of LEDs; for example, the thermal effect influences the wavelength of lights emitted from the LED, reduces the brightness of lights generated from the semiconductor device, and damages the LED device. Therefore, how to dissipate heat generated by the high power LED become the important issue of the LEDs.

US Applications Nos. 2004/0188696 and 2004/0203189 disclosed a LED package and the method for manufacturing the same based on the Surface Mount Technology (SMT). Each LED package includes a LED chip, and each chip is flip-chip bonded onto a frontside of the sub-mount wafer using boning bump. A plurality of arrays of openings is drilled into the electrically insulating sub-mount wafer. A metal is applied to the drilled openings to produce a plurality of via arrays. The p-type and n-type contacts of each flip-chip bonded LED electrically communicate with a solderable backside of the sub-mount wafer through a via array. A thermal conduction path is provided for thermally conducting heat from the flip-chip bonded LED chip to the solderable backside of the sub-mount wafer. Subsequent to the flip-chip bonding, the sub-mount wafer is separated to produce the surface mount LED packages.

However in US Applications Nos. 2004/0188696 and 2004/0203189, it requires drilled via array with filled metal within the sub-mount wafer and thus increases the manufacturing cost. Furthermore, it becomes complicated to flip-chip bond each chip onto the sub-mount wafer using bonding bump. Therefore, it would be beneficial if the LED packages have excellent thermal conductive paths without the provision of the sub-mount wafers.

SUMMARY OF THE DISCLOSURE

The present disclosure provides a method for forming a light-emitting apparatus. The method comprises the steps of providing a first board having a plurality of first metal contacts, providing a substrate, forming a plurality of light-emitting stacks and trenches on the substrate wherein the light-emitting stacks are apart from each other by the plurality of the trenches, bonding the light-emitting stacks to the first board, forming an encapsulating material commonly on the plurality of the light-emitting stacks, and cutting the first board and the encapsulating material to form a plurality of chip-scale LED units.

In one embodiment of the present disclosure, the method further comprises forming an opaque layer in the trench and enclosing the light-emitting stacks for preventing the light emitted from neighboring light-emitting stacks from mutually interfering or crosstalk.

In one embodiment of the present disclosure, the method further comprises selectively forming a first wavelength converting material on a first light-emitting stack and configured to convert the light emitted from the first light-emitting stack to a first light, selectively forming a second wavelength converting material on a second light-emitting stack and configured to convert the light emitted from the second light-emitting stack to a second light, and providing a third light-emitting stack devoid of any wavelength converting material formed thereon, wherein the light emitted from the first, second, and third light-emitting stacks is a blue light, and wherein the first light is a green light, and the second light is a red light.

In one embodiment of the present disclosure, the method further comprises removing the substrate to expose a surface of the light-emitting stacks after bonding the light-emitting stacks to the first board and roughening the exposed surface of the light-emitting stacks.

In one embodiment of the present disclosure, the method further comprises forming an underfill material substantially over the surface of the first board before bonding the light-emitting stacks to the first metal contacts.

In one embodiment of the present disclosure, the method further comprises providing a second board having a plurality of second metal contacts, and bonding the plurality of chip-scale LED units to the second metal contacts of the second board.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF THE DISCLOSURE

Figure 1A:
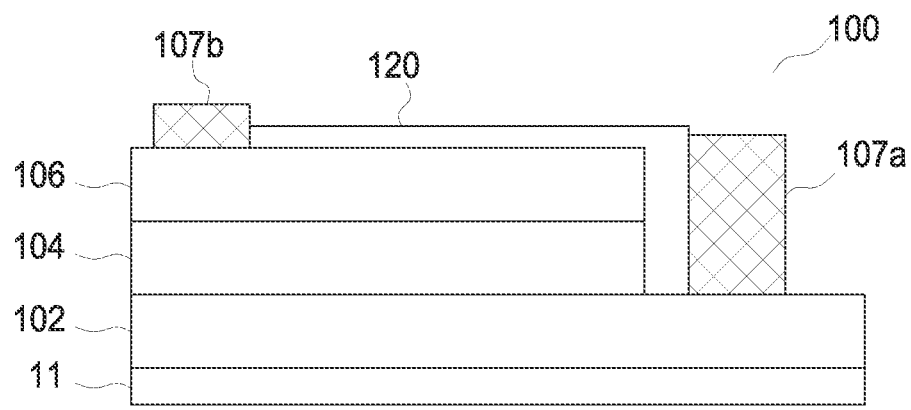
FIGS. 1A-1E illustrate cross-sectional views of forming a light emitting device (LED) in accordance with one embodiment of the present disclosure.

FIGS. 1A-1E illustrate the method for forming a light emitting device (LED) according to one embodiment of the present disclosure. Referring to FIG. 1A, at first, a light emitting structure 100 is formed. The light emitting structure 100 includes a substrate 11, a first conductive layer 102 as a cladding layer, an active layer 104 disposed on the layer 102 as a light emitting layer, and a second conductive layer 106 disposed on the active layer 104 as another cladding layer. Preferably, as shown in FIG. 1A, an electrode or bonding pad 107a is disposed on an exposed portion of the layer 102, and another electrode or bonding pad 107b is disposed on the layer 106. The manufacture method and the material (e.g., Aluminum) of electrode or bonding pads 107a and 107b are well known to those skilled in the art and thus are omitted hereinafter. Furthermore, in one embodiment, the light emitting structure 100 includes a passivation layer 120 to protect the light emitting structure 100. Also, the manufacture method and the material (e.g., $SiO_2$) of passivation layer 120 are well known to those skilled in the art and thus omitted hereinafter.

The first conductive layer 102 and the second conductive layer 106 can be embodied as any semiconductor materials known to those skilled in the art, preferably as III-V group compound semiconductor, such as $Al_xGa_yIn_{1-x-y}N$ or $Al_xGa_yIn_{1-x-y}P$, wherein $0 \leq x \leq 1$, $0 \leq y \leq 1$, $0 \leq x+y \leq 1$, and can be doped with P/N type dopants. Light emitting layer 104 can embodied with conventional materials (e.g., $Al_xGa_yIn_{1-x-y}N$ or $Al_xGa_yIn_{1-x-y}P$) and structures (e.g., Single Quantum Well, Multiple Quantum Well, and Double Heterostructure). The principles and mechanisms of the active layer 104 are known to those skilled in the art and thus omitted hereinafter. In addition, the light emitting structure 100 can be manufactured via the process of MOCVD (Metallic-Organic Chemical Vapor Deposition), molecular beam epitaxy (MBE), or hydride vapor phase epitaxy (HVPE).

Figure 1B:
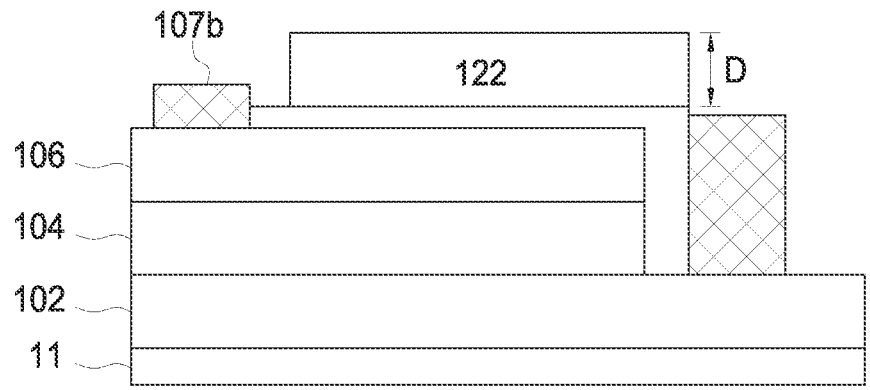

Next, as shown in FIG. 1B, a first dielectric layer 122 is formed on the light emitting structure 100. Preferably, the first dielectric layer 122 is a transparent dielectric layer with the thickness $D \leq 20$ μm, and the heat generated from the light emitting structure 100 can be easily conducted. The first dielectric layer 122 can be formed with the material such as $SiO_2$, $Si_3N_4$, or the combination of them, and via the processes of E-gun or sputter.

Figure 1C:
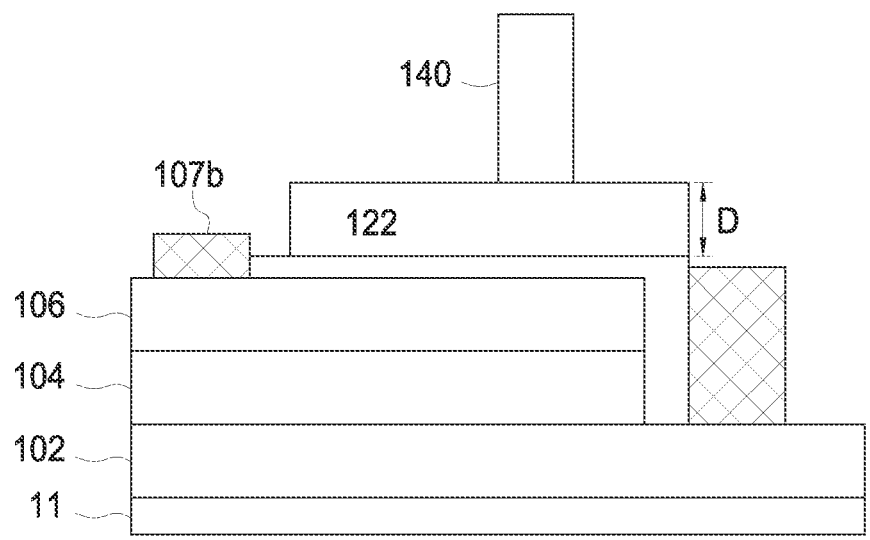

As shown in FIG. 1C, a second dielectric layer 140 is formed on the first dielectric layer 122. The layer 140 can be formed with the material such as $SiO_2$, silicon nitride, polyimide, bisbenzocyclobutene, or photoresist. Preferably, the thickness of the second dielectric layer 140 is about 25 μm, and the second dielectric layer 140 is formed by using a printing technology.

Figure 1D:
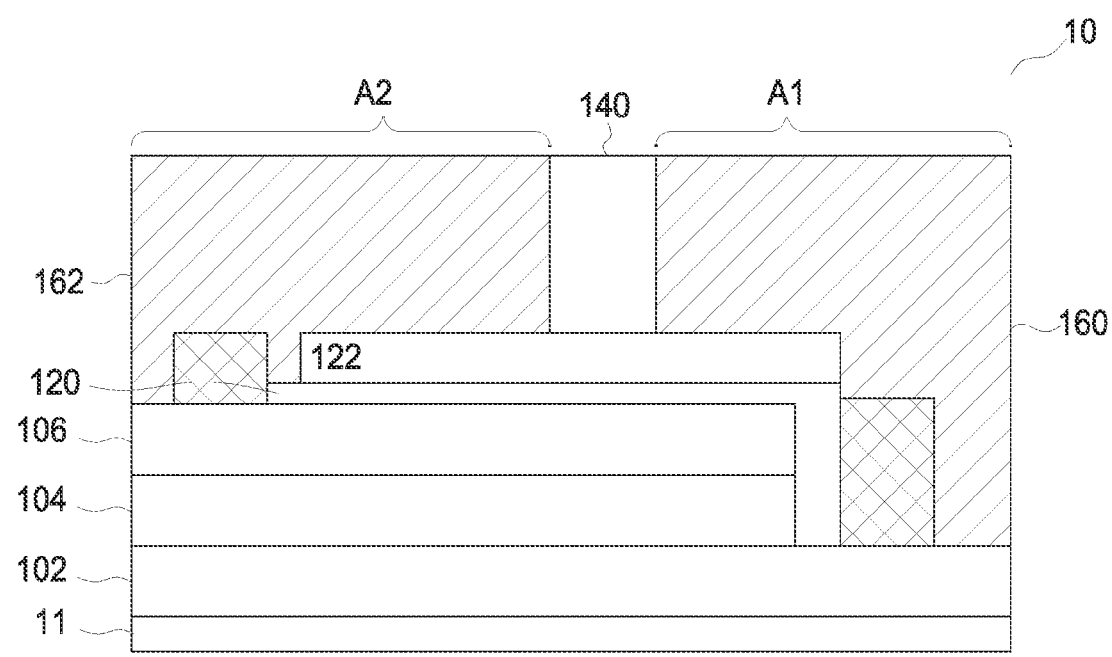

As shown in FIG. 1D, the metal layer 160 is formed after the second dielectric layer 140 is formed. The metal layer 160 is disposed on the light emitting structure 100 and is electrically connected to the first conductive layer 102. A portion of the metal layer 160 is disposed on the first dielectric layer 122. Also the metal layer 162 is formed on the on the light emitting structure 100 and is electrically connected to the second conductive layer 106. A portion of the metal layer 162 is disposed on the first dielectric layer 122. Meanwhile, the first dielectric layer 122 and the second dielectric layer 140 electrically isolate the metal layer 160 from the metal layer 162. The metal layer 160 or the metal layer 162 can be embodied with materials of Au, Al, Ag, or Alloy of them. Preferably, the metal layer 160 and the metal layer 162 are formed together by using a printing technology or electroplated. After that, the manufacture process for LED 10 is completed.

In one embodiment, the dielectric layer 122 is a transparent dielectric layer. A surface of the dielectric layer 122 contacting the metal layer 160 and/or the metal layer 162 is provided for reflecting the light emitted from the light emitting structure 100. Furthermore, the metal layer 160 and/or the metal layer 162 are thermal conductive paths for the light emitting structure 100. Large contact areas A1 and A2 of the metal layer 160 and the metal layer 162 are also beneficial to the heat dissipation.

Figure 1E:
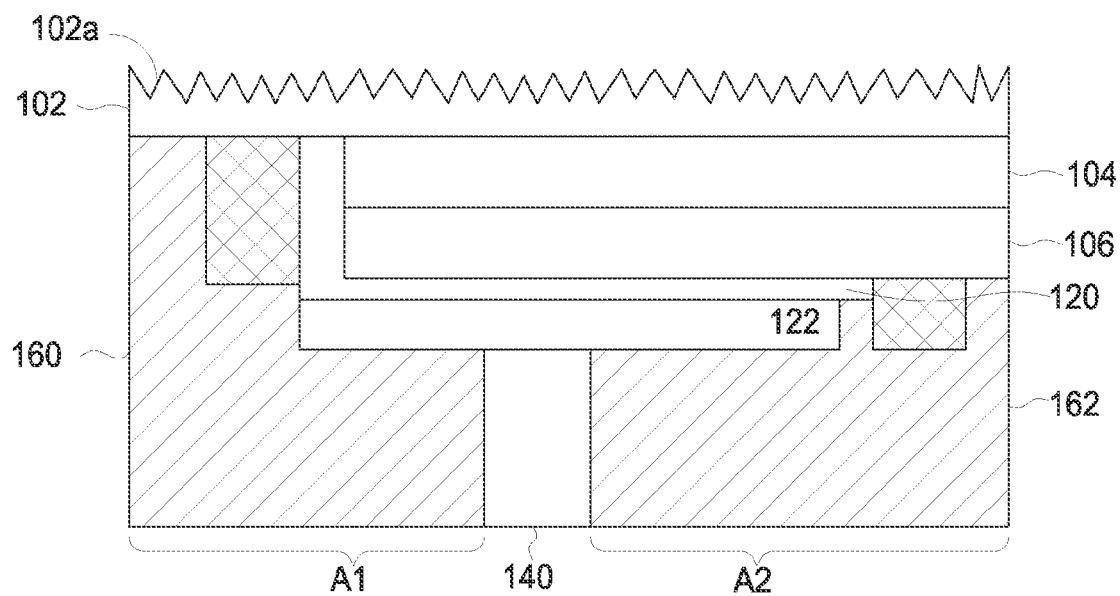

Referring to FIG. 1E, after the formation of the structure shown in FIG. 1D, the method further includes a step of removing the substrate 11 to expose the first conductive layer 102. For example, the substrate 11 can be a sapphire substrate or a GaAs substrate. When the substrate 11 is a sapphire substrate, the substrate 11 can be removed by an Excimer laser process. The Excimer laser process can be a KrF Excimer laser with an energy density of 400 mJ/cm$^2$, a wavelength of 248 nm, and a pulse width of 38 ns. As the Excimer laser radiates on the sapphire substrate at an elevated temperature, such as 60° C., the sapphire substrate is removed to expose the first conductive layer 102. Alternatively, when the substrate 11 is GaAs substrate, a solution of NH$_4$OH:35H$_2$O$_2$ or a solution of 5H$_3$PO4:3H$_2$O$_2$:3H$_2$O can be applied to remove the GaAs substrate to expose the first conductive layer 102.

After the substrate 11 is removed, the method further includes a step of roughening the surface 102a of the first conductive layer 102. For example, the first conductive layer 102 can be an Al$_x$Ga$_y$In$_{1-x-y}$N layer, and the surface 102a is roughened by using an etch solution, such as a KOH solution. Alternatively, when the first conductive layer 102 is an Al$_x$Ga$_y$In$_{1-x-y}$P layer, a solution of HCl and H$_3$PO$_4$ can be employed for 15 seconds to roughen the surface 102a of the first conductive layer 102. The rough surface 102a of the first conductive layer 102 is implemented to reduce the possibility of total reflection of light so as to increase a light extraction efficiency of the light emitting device.

Figure 1F:
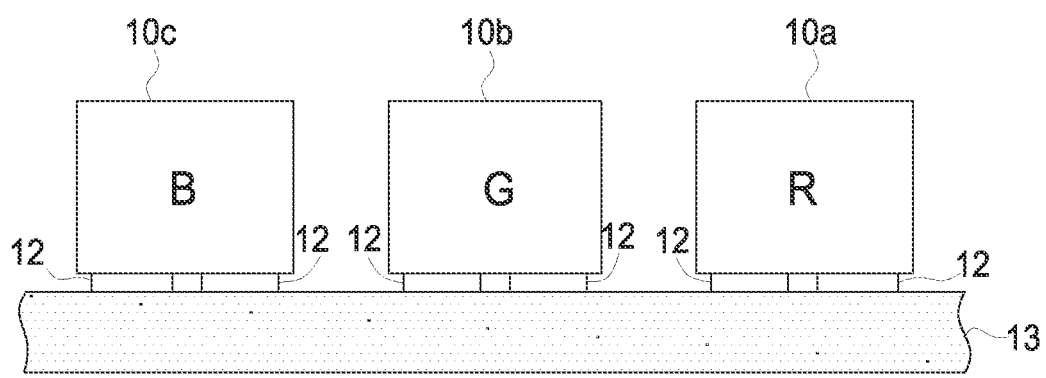
FIG. 1F illustrates LEDs in accordance with an embodiment of the present disclosure.

Like the LED 10 in FIG. 1E, LED 10a, 10b, and 10c shown in FIG. 1F, are provided with large contact areas, each of which is preferably larger than half of the section area of the LED 10. LED 10a, 10b, and 10c are directly connected to the circuit board 13 by using solder 12 instead of by "Die Bonding" and "Wire Bonding". In another embodiment, LED 10a is provided for emitting red light, LED 10b for emitting green light, and LED 10c for emitting blue light. Thus LED 10a, 10b, and 10c, when connected to the circuit boards 13, can be used in the image display application.

Figure 2A:
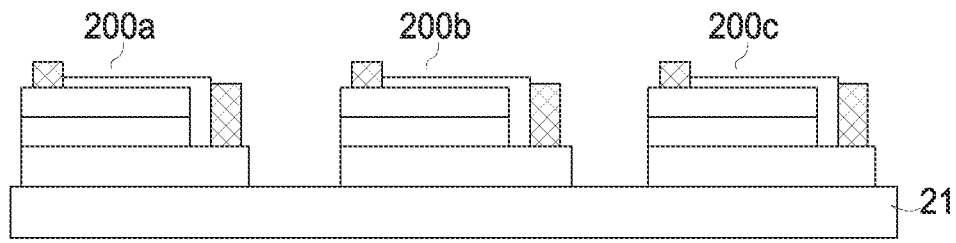
FIGS. 2A-2D illustrate cross-sectional views of forming a LED array in accordance with one embodiment of the present disclosure.

FIGS. 2A-2D illustrate the method for forming a light emitting device (LED) array according to one embodiment of the present disclosure. Referring to FIG. 2A, at first, a substrate 21 is provided. The substrate 21 can be a sapphire substrate, an GaAs substrate, or other substrates known to those skilled in the art, or the combinations of them. Next, a plurality of light emitting structures 200a, 200b, and 200c are formed on the substrate 21. The materials and the manufacture processes for light emitting structures 200a, 200b, and 200c can be referred to the elaboration for light emitting structure 100 illustrated by FIGS. 1A-1D. Similarly, light emitting structures 200a, 200b, and 200c can be manufactured via the process of MOCVD, molecular beam epitaxy, or hydride vapor phase epitaxy.

Figure 2B:
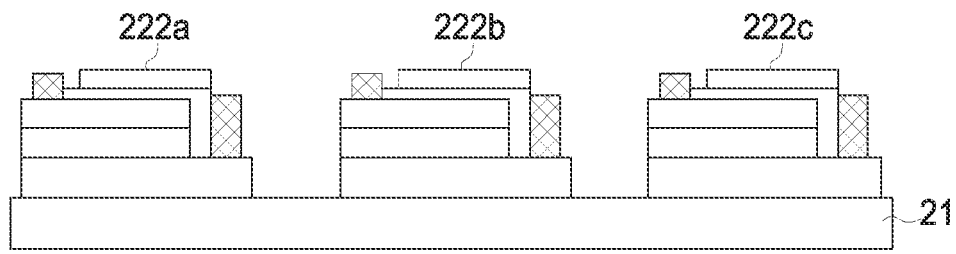

Next, as shown in FIG. 2B, a dielectric layer 222a is formed on the light emitting structure 200a, a dielectric layer 222b is formed on the light emitting structure 200b, and a dielectric layer 222c is formed on the light emitting structure 200c. Preferably, like the layer 122 shown in FIG. 1B, dielectric layers 222a, 222b, and 222c are transparent dielectric layers with each thickness D≤20 μm, and the heat generated from the light emitting structures 200a, 200b, and 200c can be easily conducted away. The dielectric layers 222a, 222b, and 222c can be formed with the material such as SiO$_2$, Si$_3$N$_4$, or the combination of them, and via the processes of E-gun or sputter.

Figure 2C:
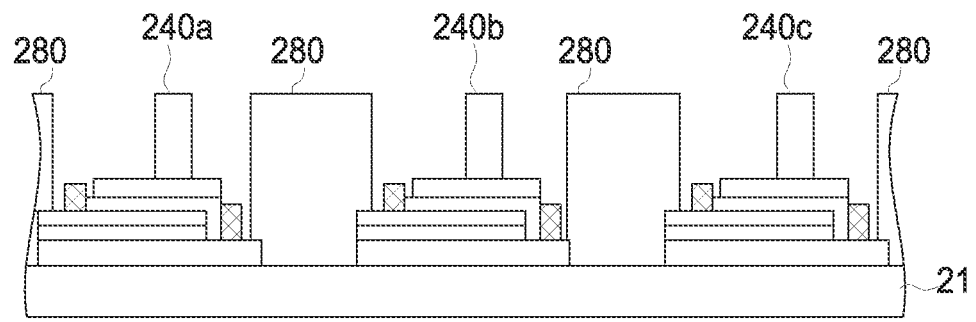
Figure 2D:
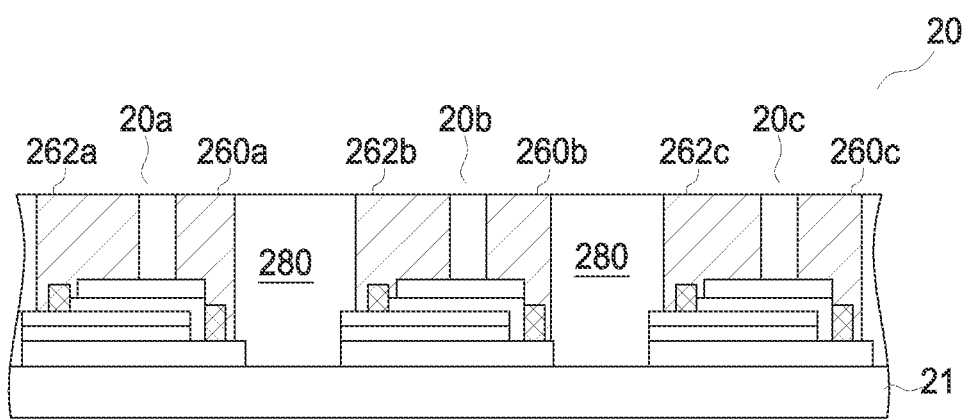

Later, as shown in FIG. 2C, a dielectric layer 240a is formed on the dielectric layer 222a, a dielectric layer 240b is formed on the dielectric layer 222b, and a dielectric layer 240c is formed on the dielectric layer 222c. The dielectric layers 240a, 240b, and 240c can be formed with the material such as SiO2, silicon nitride, polyimide, bisbenzocyclobutene, or photoresist. Preferably, like the dielectric layer 140 in FIG. 1C, the thickness of the dielectric layers 240a, 240b, and 240c are about 25 μm respectively, and the dielectric layers 240a, 240b, and 240c are formed by using a printing technology. In one embodiment, a dielectric layer 280 is further formed between light emitting structures 200a, 200b, and 200c to electrically isolate LEDs 20a, 20b, and 20c from each other (as shown in FIG. 2D). The dielectric layer 280 can be embodied with the same material (e.g., polyimide) with the layer 240a, 240b, or 240c, and is formed together with them by using a printing technology. Alternatively, the dielectric layer 280 can be embodied with the different material with the layer 240a, 240b, or 240c, and is formed through a different process.

As shown in FIG. 2D, metal layers 260a, 260b, 260c, 262a, 262b, and 262c are formed and can be embodied with materials of Au, Al, Ag, or Alloy of them. Preferably, metal layers 260a, 260b, 260c, 262a, 262b, and 262c are formed together by using a printing technology or electroplated. After that, the manufacture process for LED array 20 including LEDs 20a, 20b, and 20c is completed.

Figure 2E:
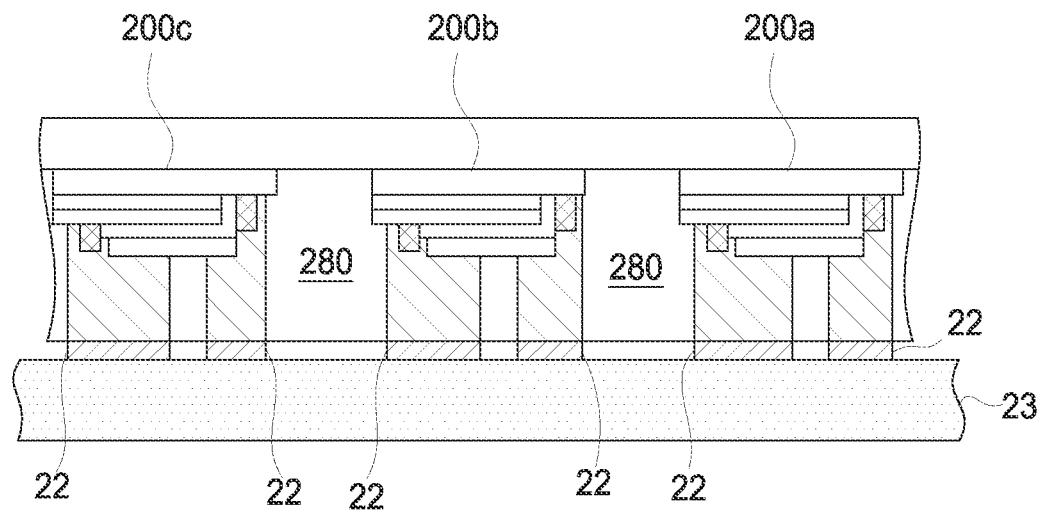
FIG. 2E illustrates the LED array connected to the circuit board in accordance with another embodiment of the present disclosure.
Figure 2F:
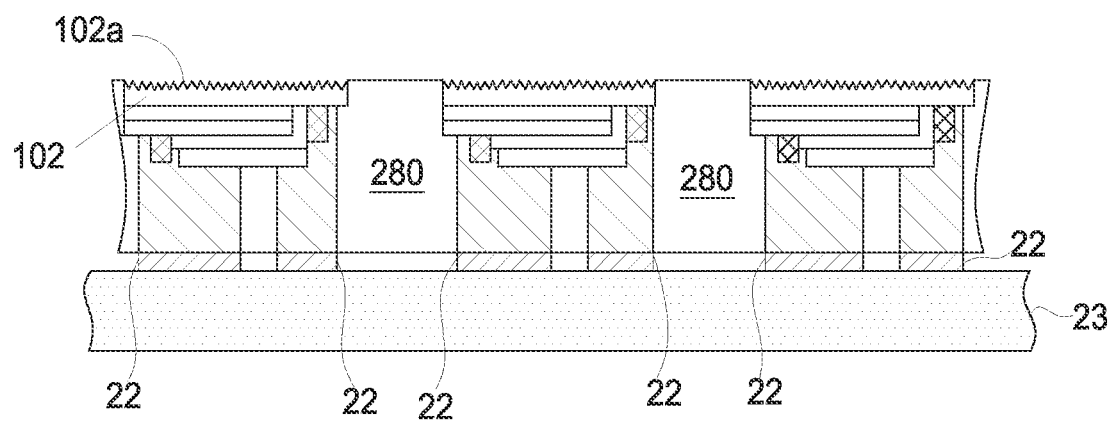
FIG. 2F illustrates a LED array having a first conductive layer with a rough surface in accordance with one embodiment of the present disclosure.

As shown in FIG. 2E, LEDs 20a, 20b, and 20c are provided with large contact areas, and are directly connected to the circuit board 23 by using solders 22. Thereafter, LED array 20 can be separated from the substrate 21 and used in the image display application. For example, after the LEDs 20a, 20b, and 20c are connected to the circuit board 23 by using solder 22, the method further includes a step of removing the substrate 21. For example, the substrate 21 can be a sapphire substrate, and be removed by an Excimer laser process. The Excimer laser process can be a KrF Excimer laser with an energy density of 400 mJ/cm$^2$, a wavelength of 248 nm, and a pulse width of 38 ns. As the Excimer laser radiates on the sapphire substrate 21 at an elevated temperature, such as 60° C., the sapphire substrate 21 is removed to expose the first conductive layer 102. Alternatively, when the substrate 11 is an GaAs substrate, a solution of NH$_4$OH:35H$_2$O$_2$ or a solution of 5H$_3$PO4:3H$_2$O$_2$:3H$_2$O can be applied to remove the GaAs substrate to expose the first conductive layer 102.

Figure 2G:
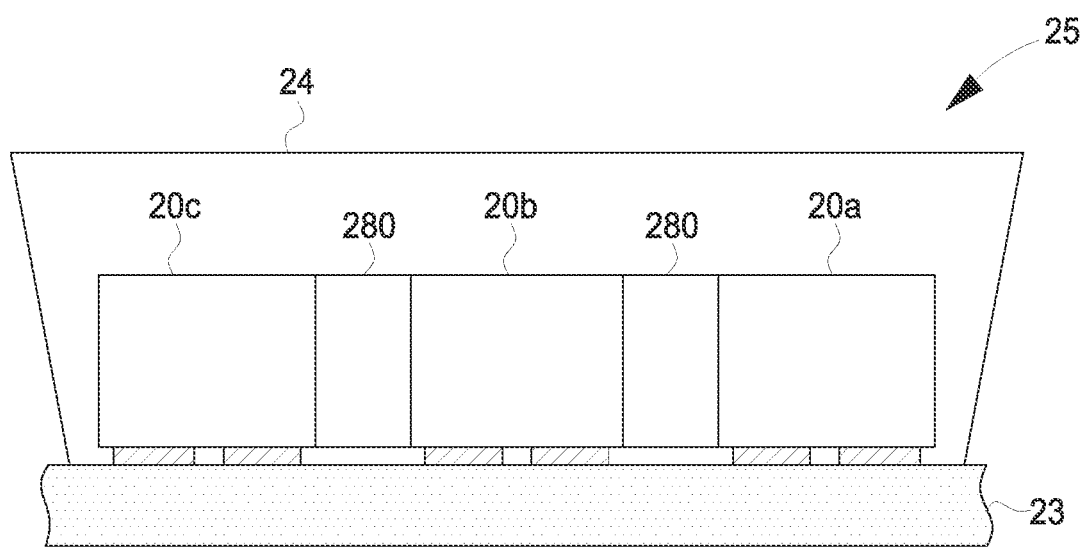
FIG. 2G illustrates a LED array package in accordance with an embodiment of the present disclosure.

After the substrate 21 is removed, the method further includes a step of roughening the surface 102a of the first conductive layer 102. For example, the first conductive layer 102 can be an Al$_x$Ga$_y$In$_{1-x-y}$N layer, and the surface 102a is roughened by using an etch solution, such as a KOH solution. Alternatively, when the first conductive layer 102 is an Al$_x$Ga$_y$In$_{1-x-y}$P layer, a solution of HCl and H$_3$PO$_4$ can be employed for 15 seconds to roughen the surface 102a of the first conductive layer 102. The rough surface 102a of the first conductive layer 102 is implemented to reduce the possibility of total reflection of light so as to increase a light extraction efficiency of the light emitting device. In another embodiment, as shown in FIG. 2G, a transparent encapsulating material 24, such as epoxy or any conventional material as appropriate, is applied to enclose the LED array 20 (including LEDs 20a, 20b, and 20c) and connected to the circuit board 23 so that an LED device package 25 is formed.

Figure 3A:
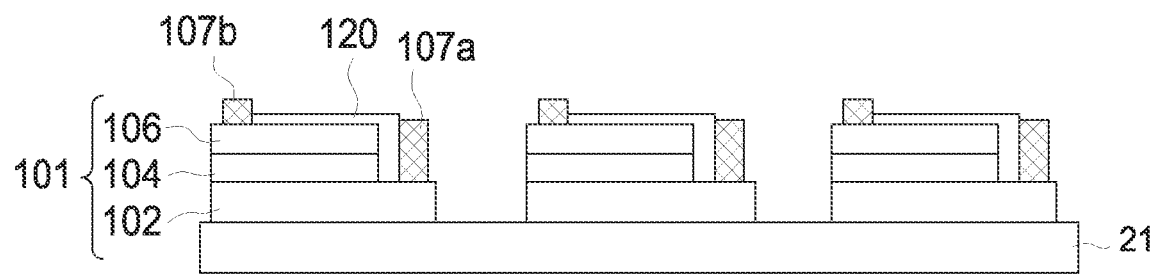
FIGS. 3A-3G illustrate one embodiment of a chip-scale RGB LED unit and the manufacturing method thereof in accordance the present disclosure.

FIGS. 3A-3G illustrate the method for forming a light emitting device (LED) array according to another embodiment of the present disclosure. Referring to FIG. 3A, a substrate 21 is provided. The substrate 21 is single crystalline and comprises sapphire, GaAs, GaN, or Si. Next, a first conductive layer 102 as a first cladding layer is epitaxially grown on the substrate 21, an active layer 104 comprising multiple quantum well (MQW) Structure as a light emitting layer is epitaxially grown on the first conductive layer 102, and a second conductive layer 106 as a second cladding layer is epitaxially grown on the active layer 104. Next, the first conductive layer 102, the active layer 104, and the second conductive layer 106 are etched to form a plurality of light-emitting stacks 101 separated from each other on the substrate 21, and a portion of the first conductive layer 102 of each light-emitting stack 101 is exposed. Next, a first dielectric layer 120 is formed on each light-emitting stack 101 and covers a portion of the first conductive layer 102, a portion of the second conductive layer 106, and a sidewall of the light-emitting stack 101. Next, a first electrode or bonding pad 107a is disposed on an exposed portion of each first conductive layer 102 and electrically connected to the first conductive layer 102, and a second electrode or bonding pad 107b is disposed on each second conductive layer 106 and electrically connected to the second conductive layer 106.

Figure 3B:
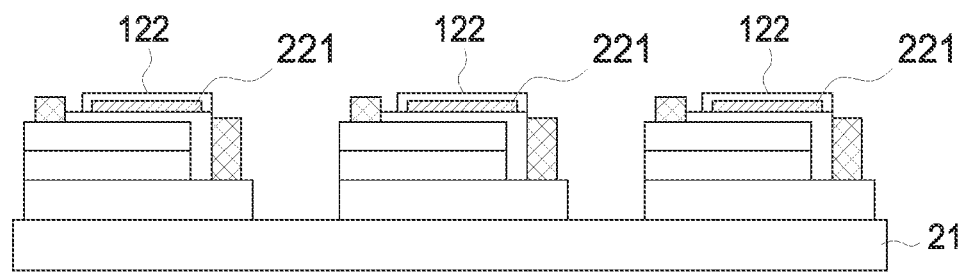
Figure 3C:
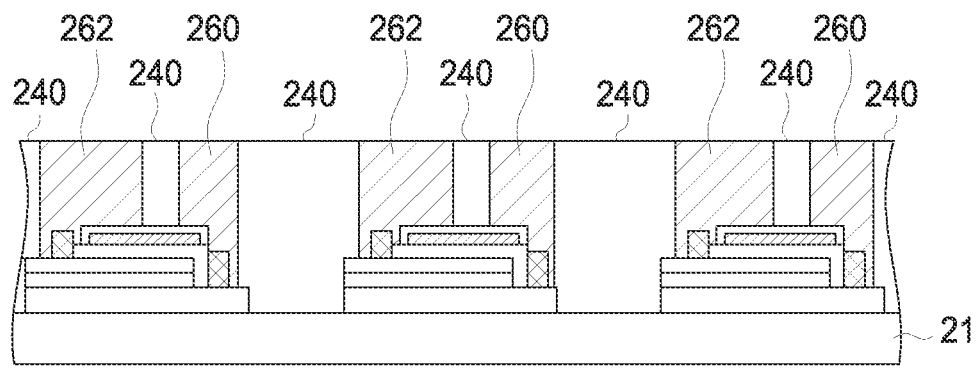

Then, as shown in FIG. 3B, a reflecting layer 221 is formed on each first dielectric layer 120, and a second dielectric layer 122 is formed on each first dielectric layer 120 and covers the reflecting layer 221. The reflecting layer 221 has a reflectivity equal to or greater than 80% for light emitted by the corresponding light-emitting stack 101. The material of the reflecting layer 221 comprises metal such as Ag, Ag alloy, Al, or Al alloy. In one embodiment, the material of the reflecting layer 221 comprises polymer mixed with inorganic particles made of metal oxide or a material having a refractive index equal to or greater than 1.8, such as an epoxy resin mixed with titanium oxide particles. The reflecting layer 221 is fully enclosed by the corresponding first dielectric layer 120 and second dielectric layer 122 such that the reflecting layer 221 is electrically insulated with the corresponding light-emitting stack 101. In another embodiment, the first dielectric layer 120 is omitted, and the reflecting layer 221 is directly formed on the second conductive layer 106 and electrically connected to the second conductive layer 106. Next, as shown in FIG. 3C, a third dielectric layer 240 is formed on each light-emitting stack 101 and the substrate 21 and exposes the corresponding first electrode or bonding pad 107a and second electrode or boding pad 107b. Next, a first metal layer 260 and a second metal layer 262 are formed within each third dielectric layer 240 and on a portion of the corresponding second dielectric layer 122. The first metal layer 260 and the second metal layer 262 are respectively formed on the corresponding first electrode or bonding pad 107a and second electrode or bonding pad 107b. The material of the first metal layer 260 and the second metal layer 262 comprise Au, Al, Ag, or the Alloy thereof. In one embodiment, the first metal layer 260 and the second metal layer 262 are formed together by using a printing process or an electroplating process.

Figure 3D:
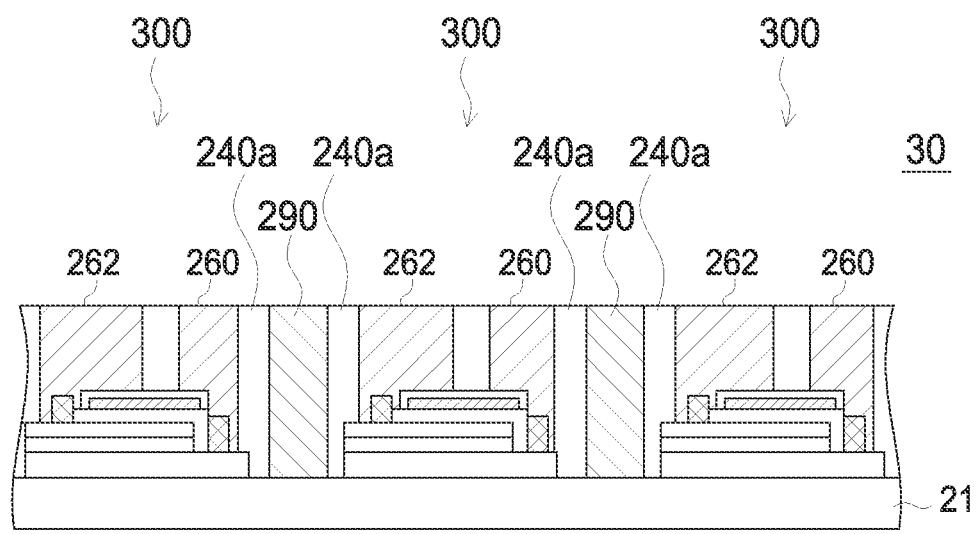

As shown in FIG. 3D, the third dielectric layer 240 between adjacent two light-emitting stacks 101 is further patterned to form cavities in the third dielectric layer 240 and expose a portion of the substrate 21, then an opaque layer 290 is formed in the cavities. In one embodiment, the opaque layer 290 serves as an reflecting layer or a light-absorption layer for reflecting or absorbing light emitted from the corresponding light-emitting stack 101 and preventing the light emitted from neighboring light-emitting stacks 101 from mutually interfering or crosstalk. The opaque layer 290 has a transmittance less than 50% for light emitted by the corresponding light-emitting stack 101. The material of the opaque layer 290 comprises metal or comprises a polymer mixing with inorganic particles made of metal oxide or a material having a refractive index equal to or greater than 1.8, such as an epoxy resin mixing with titanium oxide particles. Therefore, the manufacture process for LED array 30 comprising a plurality of LEDs 300 is completed.

Figure 3E:
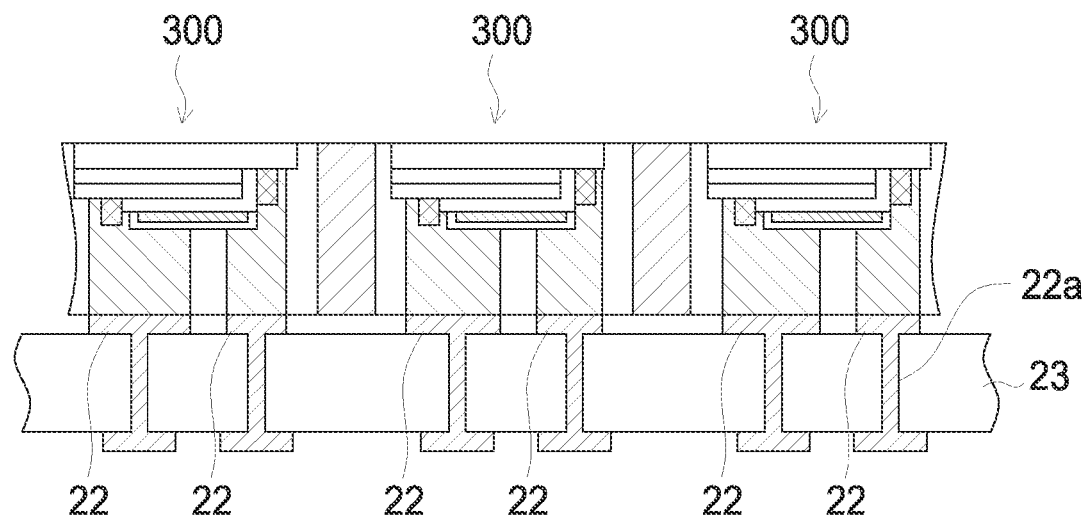

As shown in FIG. 3E, a circuit board 23 is provided. the circuit board 23 comprises a plurality of metal contacts 22 formed on the upper surface and the lower surface of the circuit board 23 and a plurality of conductive channels 22a penetrating the circuit board 23 for connecting the metal contacts 22 on the upper surface of the circuit board 23 to the metal contacts 22 on the lower surface of the circuit board 23. The metal contacts 22 comprises metal or metal alloy. In one embodiment, the metal contacts 22 comprise solders. The circuit board 23 comprises FR-4, BT (Bismaleimide-Triazine) resin, ceramics or glass. The thickness of the circuit board 23 is between 50 and 200 microns for being sufficient to support LEDs but still compact. The LED array 30 is directly flip-bonded to the circuit board 23 by aligning the first metal layer 260 and the second metal layer 262 of each LEDs 300 to the corresponding metal contacts 22. It is noted that air gaps may be formed between the LED array 30 and the circuit board 23 other than the area of metal contacts 22. Optionally, an underfill material is filled in the gaps to enhance the bonding strength and mechanical support. Thereafter, the substrate 21 of the LED array 30 is removed after the LED array 30 is connected to the circuit board 23. In one embodiment, the substrate 21 comprises sapphire, the light-emitting stacks 101 comprises gallium nitride, and the method for removing the substrate 21 comprises using an Excimer laser to radiate at the interface of the first conductive layers 102 and the substrate 21 under an environment with an elevated temperature, such as 60° C., and then the substrate 21 is separated from the first conductive layers 102. The Excimer laser comprises a KrF Excimer laser with an energy density of 400 mJ/cm$^2$, a wavelength of 248 nm, and a pulse width of 38 ns. In another embodiment, the substrate 21 comprises GaAs, and the method for removing the substrate 21 comprises using a chemical solution with a composition of $NH_4OH:35H_2O_2$ or a composition of $5H_3PO4:3H_2O_2:3H_2O$ to totally etch away the substrate 21 and then expose the first conductive layers 102, the third dielectric layers 240a, and the opaque layers 290.

Figure 3F:
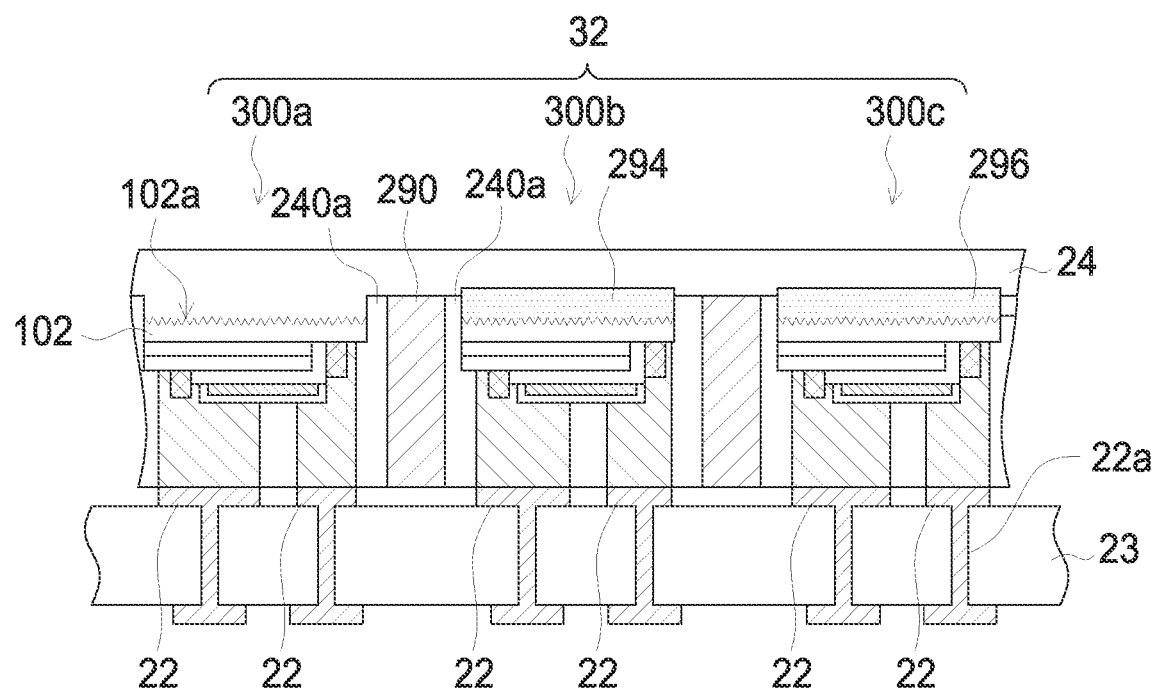
Figure 4A:
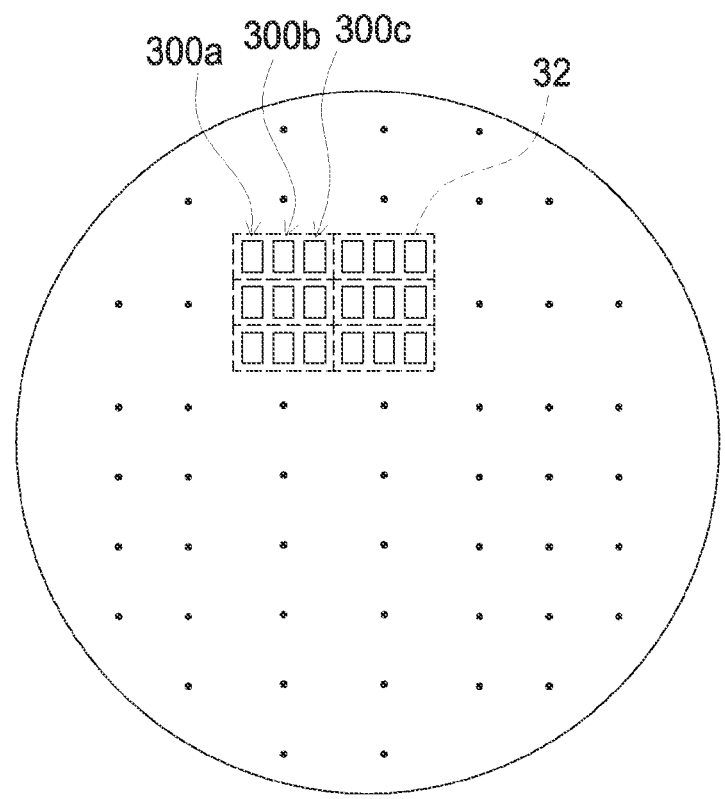
FIG. 4A is a top view of an LED array flip-bonded to a circuit board depicted in FIG. 3F.

As shown in FIG. 3F, after the substrate 21 is removed, the method further includes a step of roughening the exposed surface of the first conductive layers 102. In one embodiment, the first conductive layers 102 comprises $Al_xGa_yIn_{1-x-y}N$ (0≤x, y≤0), and the exposed surfaces of the first conductive layers 102 are etched by KOH solution to form a rough surface 102a on each first conductive layer 102. In another embodiment, the first conductive layers 102 comprise $Al_xGa_yIn_{1-x-y}P$ (0≤x, y≤0), and the exposed surfaces of the first conductive layers 102 are etched by HCl solution or $H_3PO_4$ solution for 15 seconds to form a rough surface 102a on each first conductive layer 102. The rough surface 102a of each first conductive layer 102 can reduce the possibility of total internal reflection (TIR) of light within each LED 300 so as to increase light extraction efficiency of the device. After the roughening step, a plurality of concave regions is formed on the rough surface 102a and substantially enclosed by the third dielectric layers 240a. In one embodiment, in order to form a chip-scale RGB LED unit for a display, the method further includes selectively coating a first wavelength converting layer 294 on the LED 300b, as shown in FIG. 3F, for converting light. For example, blue light having a dominant wavelength between 430 nm and 470 nm, emitted by the light-emitting stack 101 of LED 300b is converted into a first converted light, e.g. red light having a dominant wavelength between 610 nm and 690 nm. A second wavelength converting layer 296 is further selectively coated on the LED 300c for converting the light emitted from the light-emitting stack 101 of LED 300c into a second converted light, e.g. a green light having a dominant wavelength between 500 nm and 570 nm. LED 300a is not coated with any wavelength converting material for emitting the blue light directly exited from the rough surface 102a of LED 300a. In one embodiment, the first or second wavelength converting layers are in a form of a sheet by aggregating nano-scale quantum dots or nano-scale phosphor particles with a substantially uniform thickness and bonded to the light-emitting stack 101 by an adhesive bonding layer (not shown). In another embodiment, the first or second wavelength converting layers comprise nano-scale quantum dots or nano-scale phosphor particles having an average diameter or average feature length between 10 nm and 500 nm. The diameter or feature length of each of the nano-scale quantum dots or nano-scale phosphor particles is substantially lower than 1000 nm. The nano-scale quantum dots comprises semiconductor material, such as a group II-VI material having a composition of $Zn_xCd_yMg_{1-x-y}Se$ where x and y are determined such that the group II-VI material is capable of being optically pumped to emit green or red light. The term "feature length" is defined as the maximum length between any two points of a phosphor particle or quantum dot. After that, a transparent encapsulating material 24, such as epoxy or silicone is applied to the upper surface of the LED array 32 for affixing the wavelength converting materials to the light-emitting stacks 101 and serving as optical lens for LEDs 300a, 300b, 300c of the LED array 32. In another embodiment, the material of the wavelength converting layer that covers on the LEDs is the same, FIG. 4A shows a top view of the LED array 32 flip-bonded to the circuit board 23 of FIG. 3F. The LED array 32 and the circuit board 23 are both in a wafer form with same or similar dimension. The LED array 32 comprises a plurality of RGB LED groups arranged alternately and sequentially in two dimensions, and each group comprises one LED 300a, one LED 300b, and one LED 300c as enclosed by the dashed lines.

Figure 3G:
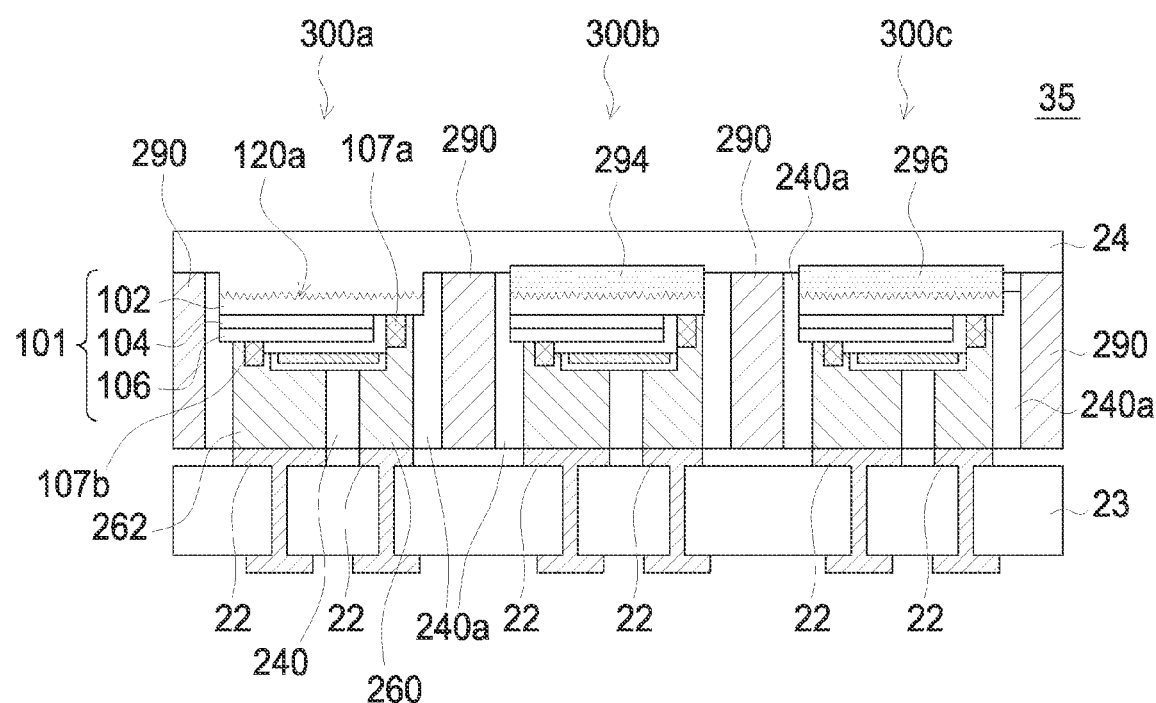

Finally, a dicing step is performed to cut the LED array 32 and the circuit board 23 simultaneously to form a plurality of chip-scale RGB LED units 35 as shown in FIG. 3G, each having one RGB LED group including an LED 300a (blue LED) configured to emitting blue light, an LED 300b (red LED) configured to emitting red light, and an LED 300c (green LED) configured to emitting green light. The chip-scale RGB LED unit 35 is a package-free and surface-mounted device and is configured to be directly mounted to a printed circuited board (PCB) without further traditional packaging process after the dicing step. The transparent encapsulating material 24 commonly covers LEDs 300a, 300b, and 300c without extending to sidewalls of the light-emitting stacks of LEDs 300a, 300b, and 300c. In one embodiment, the dicing step is performed to cut the LED array 32 and the circuit board 23 simultaneously to form a plurality of chip-scale RGB LED units wherein each of the chip-scale RGB LED units comprises a plurality of RGB LED groups. The plurality of RGB LED groups in one chip-scale RGB LED unit is arranged as I×J array, wherein I and J are positive integers, and at least one of I and J are greater than 1. The I/J ratio is preferably approximately or equal to 1/1, 3/2, 4/3, or 16/9.

Figure 4B:
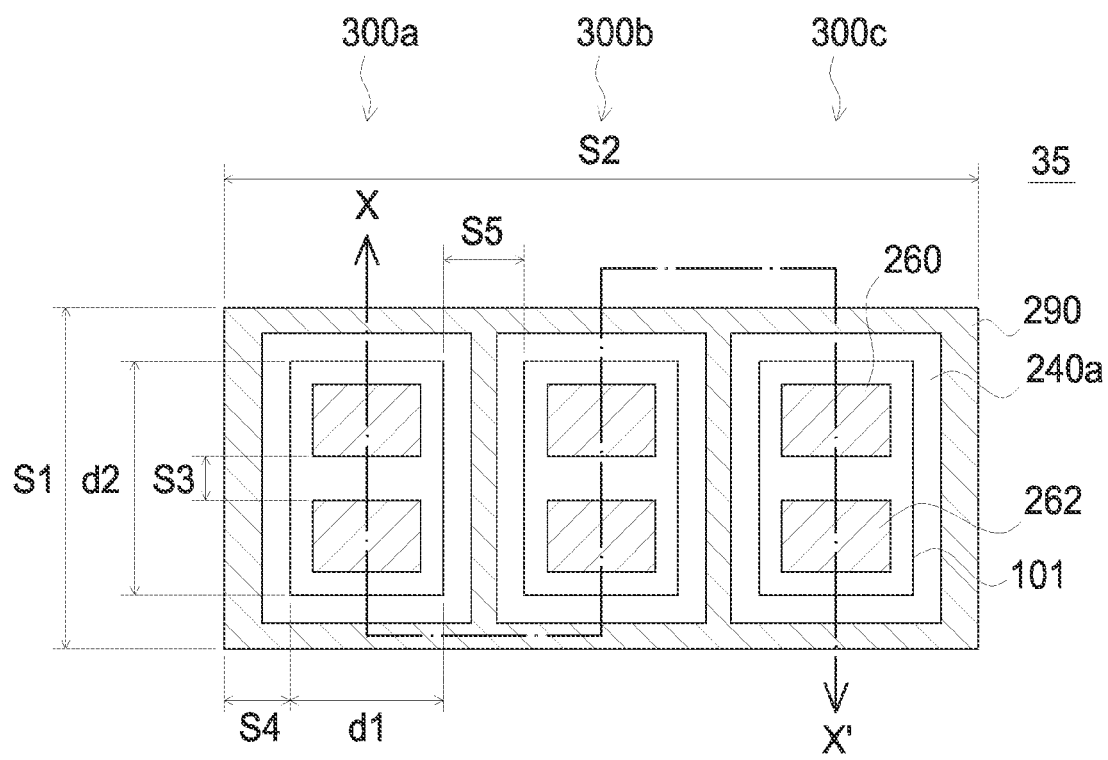
FIG. 4B is a top view of a chip-scale RGB LED unit depicting in FIG. 3G.

FIG. 4B shows the top view of the chip-scale RGB LED unit 35 comprising one RGB LED group in FIG. 3G. The chip-scale RGB LED unit 35 is shaped as a first rectangle with a first short side and a first lengthy side, wherein the first short side has a first width S1 and the first lengthy side has a first length S2 greater than the first width S1. Each of light-emitting stacks 101 is shaped as a second rectangle with a second short side and a second lengthy side, wherein the second short side has a second width d1 and the second lengthy side has a second length d2 greater than the second width d1. Light-emitting stacks 101 are arranged such that the second short sides of the light-emitting stacks 101 are substantially parallel to the first lengthy side of the chip-scale RGB LED unit 35 or substantially perpendicular to the first short side of the chip-scale RGB LED unit 35. In one embodiment, the chip-scale RGB LED unit 35 is used as one pixel of an indoor display panel. To realize full LED pixel in an TV display with 40 inches diagonal and 1024*768 pixel resolution, the area of each pixel has to be smaller than approximately 0.64 mm². Therefore, the area of the chip-scale RGB LED unit 35 is exemplarily smaller than 0.36 mm². The first length S2 and the first width s1 are both smaller than 0.6 mm, and the aspect ratio of the chip-scale RGB LED unit 35, i.e. S2/S1 is preferably smaller than 2/1. The distance between two metal layers 260 and 262, i.e. the first distance S3, is limited to the alignment control of the bonding process between the LED array and the circuit board in accordance with the present disclosure. The first distance S3 is equal to or greater than 25 microns to ensure the process tolerance, but smaller than 150 microns to provide sufficient contact area for electrical conduction. The distance between one edge of the chip-scale RGB LED unit 35 and one light-emitting stack 101 therein, i.e. the second distance S4, is limited to the tolerance of the dicing step. The second distance S4 is equal to or greater than 25 microns to ensure the dicing tolerance, but smaller than 60 microns to maintain the compactness. The distance between two adjacent LEDs, i.e. the third distance S5 is limited by the lithography-etching process, and is smaller than 50 microns, or preferably smaller than 25 microns for reserving more area for the light-emitting stacks. For each light-emitting stacks 101 in a chip-scale RGB LED unit 35, the second width d1 is between 20 and 150 microns and the second length d2 is between 20 and 550 microns. The ratio of the area of the chip-scale RGB LED unit 35 to the total area of the light-emitting stacks 101 is smaller than 2 or between 1.1 and 2, and preferably between 1.2 and 1.8. The area of the light-emitting stack depends on the required illumination and the pixel dimension. It is noted that the shape of the chip-scale RGB LED unit 35 can also be square with four sides being the same as the first width S1. Similarly, the shape of the light-emitting stack 101 can also be square with four sides being the same as the second width d1. In one embodiment, there are two chip-scale RGB LED units 35 included in one pixel, and one is for normal operation and the other one is for redundancy in case the one for normal operation is malfunctioned. The first width S1 is preferably less than 0.3 mm in order to arrange two chip-scale RGB LED units 35 included in one pixel. By taking the advantage of the present disclosure, using LEDs as pixel elements in a flat TV can be realized, and the resolution can be further enhanced to double or quadruple of 1024*768 pixel resolution. In another embodiment, one chip-scale RGB LED unit comprises two RGB LED groups; one for normal operation and the other one for redundancy in case the one for normal operation is malfunctioned.

Figure 5A:
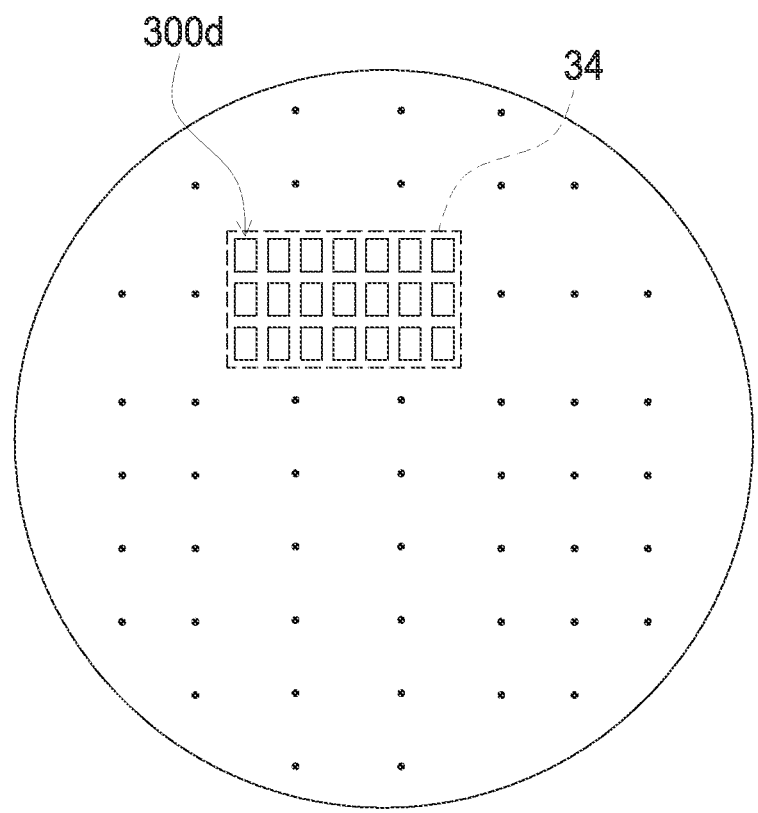
FIG. 5A is a top view of an LED array flip-bonded to a circuit board depicted in accordance with another embodiment of the present disclosure.
Figure 5B:
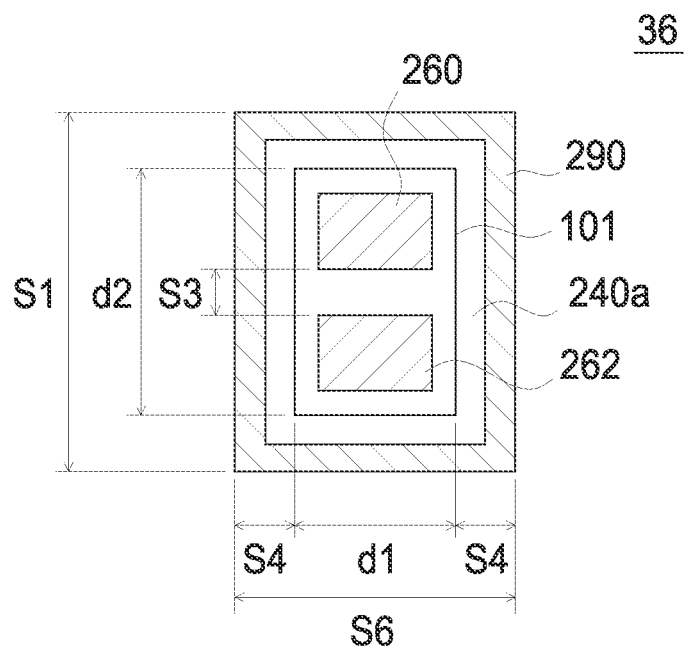
FIG. 5B is a top view of a chip-scale LED unit in accordance with one embodiment of the present disclosure.
Figure 5C:
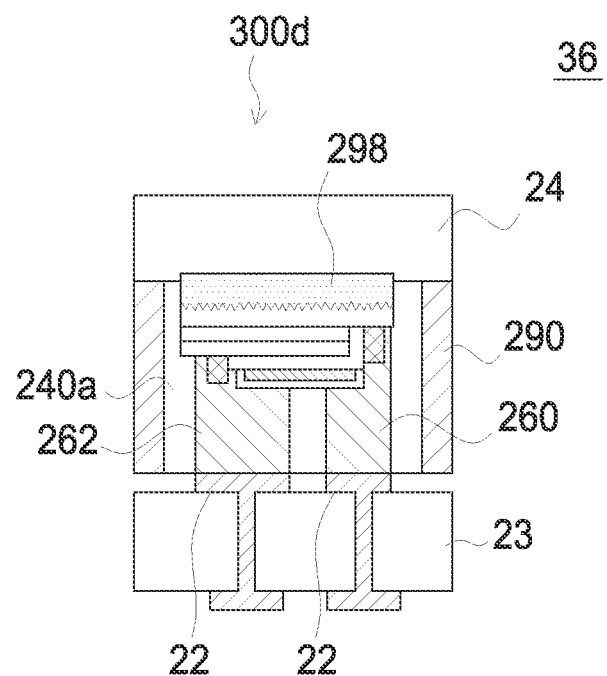
FIG. 5C is a cross-sectional view of a chip-scale LED unit in accordance with one embodiment of the present disclosure.

FIGS. 5A-5C show one embodiment for a chip-scale LED unit in accordance with the present disclosure. The manufacturing method and structure is similar to the foregoing embodiment depicted in FIGS. 3A-3G and the related disclosure. The difference is that, before the dicing step, the LED array 34 comprises a plurality of identical LEDs 300d as shown in FIG. 5A. Each LED 300d is coated with an identical or different wavelength converting layer 298 for converting light emitted by the light-emitting stack 101 of the corresponding LED 300d, e.g. blue light having a dominant wavelength between 430 nm and 470 nm, into a converted light, e.g. yellow light, green light, or red light. FIG. 5B and FIG. 5C show the top view and the cross-sectional view of the chip-scale LED unit 36 containing one singular LED after the dicing step. The dimension of the chip-scale LED unit 36 is the same or similar to that in FIG. 4B. The chip-scale RGB LED unit 36 is shaped as a first rectangle with a first short side and a first lengthy side, wherein the first lengthy side has a first length S1 and the first short side has a first width S6 smaller than the first length S1. Each of light-emitting stacks 101 is shaped as a second rectangle with a second short side and a second lengthy side, wherein the second short side has a second width d1 and the second lengthy side has a second length d2 greater than the second width d1. Light-emitting stacks 101 is arranged such that the second short side of the light-emitting stack 101 is substantially parallel to the first short side of the chip-scale RGB LED unit 36 or substantially perpendicular to the first lengthy side of the chip-scale RGB LED unit 36. In one embodiment, the chip-scale RGB LED unit 36 is used as part of a pixel of an indoor display panel. The area of the chip-scale RGB LED unit 36 is exemplarily smaller than 0.12 mm$^2$. The first length S1 and the first width S6 are both smaller than 0.2 mm, and the aspect ratio of the chip-scale RGB LED unit 36, i.e. S1/S6 is preferably smaller than 2/1. The distance between two metal layers 260 and 262, i.e. the first distance S3, is limited to the alignment control of the bonding process between the LED array and the circuit board in accordance with the present disclosure. The first distance S3 is equal to or greater than 25 microns to ensure the process tolerance, but smaller than 150 microns to provide sufficient contact area for electrical conduction. The distance between one edge of the chip-scale RGB LED unit 36 and the light-emitting stack 101 therein, i.e. the second distance S4, is limited to the tolerance of the dicing step. The second distance S4 is equal to or greater than 25 microns to ensure the dicing tolerance, but smaller than 60 microns to maintain the compactness. For the light-emitting stack 101 in a chip-scale RGB LED units 36, the second width d1 is between 20 and 150 microns and the second length d2 is between 20 and 550 microns. The ratio of the area of the chip-scale RGB LED unit 35 to the total area of the light-emitting stack 101 is smaller than 2 or between 1.1 and 2, and preferably between 1.2 and 1.8. The area of the light-emitting stack depends on the required illumination and the pixel dimension. It is noted that the shape of the chip-scale RGB LED units 36 can also be square with four sides being the same as the first width S6. Similarly, the shape of the light-emitting stack 101 can also be square with four sides being the same as the second width d1. In one embodiment, there are at least three chip-scale RGB LED units 36 included in one pixel for illuminating blue, red, and green light.

Figure 5D:
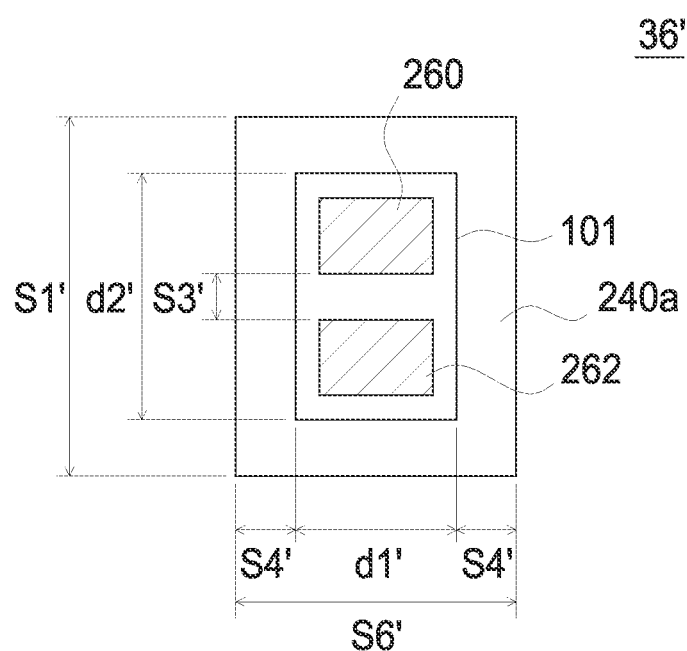
FIG. 5D is a top view of a chip-scale LED unit in accordance with another embodiment of the present disclosure.
Figure 5E:
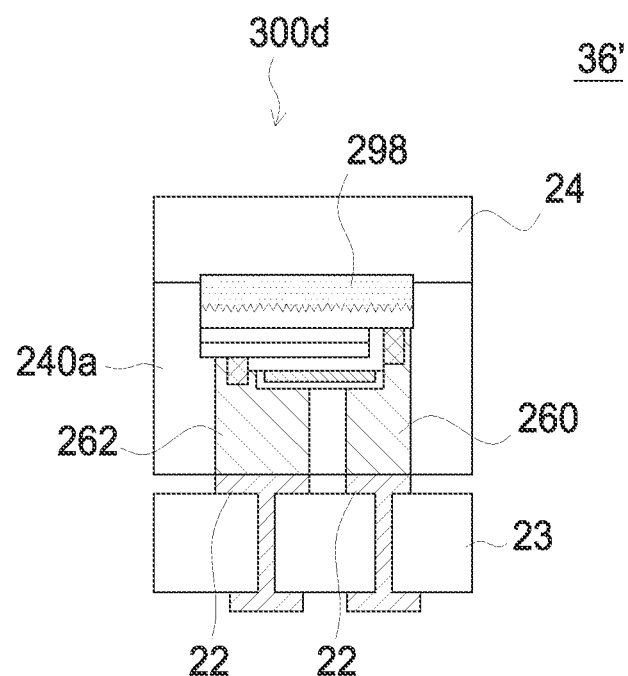
FIG. 5E is a cross-sectional view of the chip-scale LED unit depicted in FIG. 5D.

FIGS. 5D-5E show another embodiment for a chip-scale LED unit in accordance with another embodiment of the present disclosure. The manufacturing method and structure is similar to the foregoing embodiment depicted in FIGS. 5A-5C and the related disclosure. The difference is that the opaque layer 290 is optionally omitted. The chip-scale LED unit 36' is directly surface-mounted to a lighting board contained in a lighting fixture. The area of the light-emitting stack 101 depends on the required illumination and the dimension of the lighting board or the lighting fixture. The area of the light-emitting stack 101 within the chip-scale LED unit 36' is exemplarily from 100 mil$^2$ to 200 mil$^2$ for low power application (e.g. below 0.3 watts), 201 mil$^2$ to 900 mil$^2$ for middle power application (e.g. 0.3-0.9 watts), or greater than 900 mil$^2$ for high power application (e.g. above 0.9 watts). The dielectric layer 240a surrounding the light-emitting stack 101 is served as a coupling lens for extracting light out of the chip-scale LED unit 36'. The ratio of the area of the chip-scale LED unit 36' to the area of the light-emitting stack 101 is equal to or greater than 9, and preferably equal to or greater than 15 for better light extraction efficiency and light dispersion. The distance between two metal layers 260 and 262, i.e. the first distance S3', is limited to the alignment control of the bonding process between the LED array and the circuit board in accordance with the present disclosure. The first distance S3' is equal to or greater than 25 microns to ensure the process tolerance, but smaller than 150 microns to provide sufficient contact area for electrically conducting. It is noted that the shape of the chip-scale LED unit 36 can also be square with the length of four sides being the same as the first width S6'. Similarly, the shape of the light-emitting stack 101 can also be square with the length of four sides being the same as the second width d1'. The first width S6' is equal to or greater than 3 times of the second width d1', or preferably equal to or greater than 4 times of the second width d1' for better light extraction efficiency. In one embodiment, the dielectric layer 240a has asymmetric thickness on the sidewalls of the light-emitting stack 101 such that a first ratio of the first width S6' to the second width d1' is different from a second ratio of the first length S1' to the second length d2' to achieve an asymmetric light field under operation when viewing from the top of the chip-scale LED unit 36'. The first ratio is at least 2 times of the second ratio, or preferably 4 times of the second ratio.

Figure 6A:
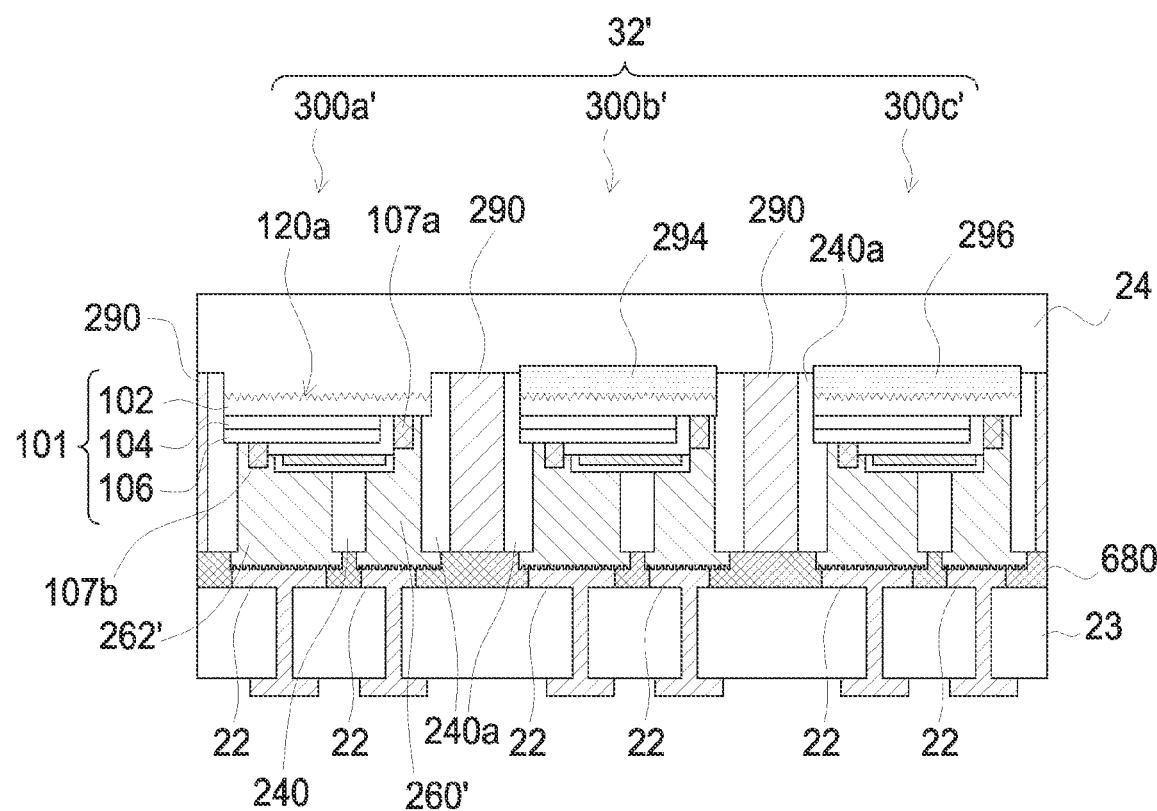
FIG. 6A illustrates a chip-scale RGB LED unit in accordance with another embodiment of the present disclosure.

FIG. 6A shows another embodiment of a chip-scale RGB LED unit in accordance with another embodiment of the present disclosure. The manufacturing method and structure of the chip-scale RGB LED unit 65 is similar to the foregoing embodiment depicted in FIGS. 3A-3G and the related disclosure. The difference is that an underfill material 680 is filled in the gaps between the LED array 32' and the circuit board 23 to enhance the bonding strength and provide a current path between the circuit board 23 and the LEDs. The underfill material 680 comprises an anisotropic conductive film (ACF) that is capable of conducting current in a vertical path between the LED array 32' and the circuit board 23, and isolating current in a lateral path parallel to the LED array 32' or the circuit board 23. The underfill material 680 is coated on the circuit board 23 prior to bonding the LED array to the circuit board 23. In one embodiment, the first metal layers 260' and the second metal layers 262' does not contact with the metal contacts 22 of the circuit board 23. The underfill material 680 is between the metal layers and the metal contacts for conducting current between the metal layers and the metal contacts. The metal layers are patterned to form a plurality of depressions and protrusions on the surface facing the metal contacts. Therefore, the contacting surface area is increased and the bonding strength is enhanced. The plurality of depressions and protrusions is in a regular form or an irregular form, and the surface roughness Ra is between 0.5 and 5 microns. The benefit for using ACF as an underfill material is that the distance between two metal layers 260' and 262', i.e. the first distance S3 as shown in FIG. 4B, can be lower than 25 microns.

Figure 6B:
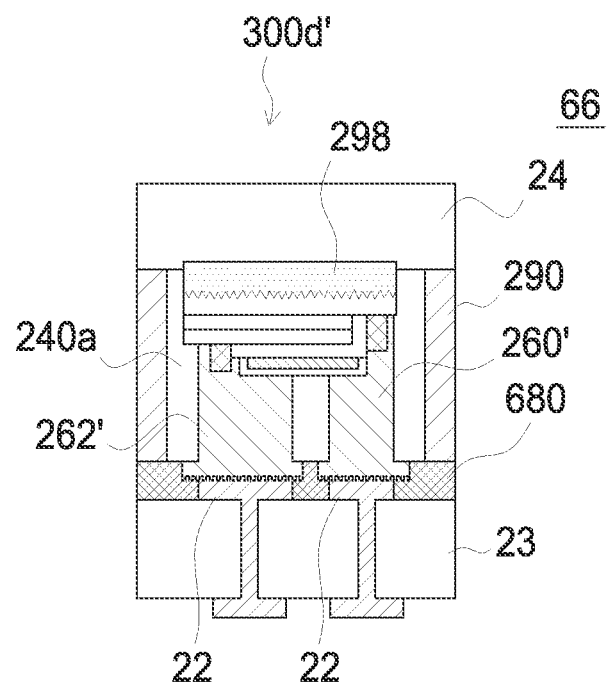
FIG. 6B illustrates a chip-scale LED unit in accordance with another embodiment of the present disclosure.
Figure 6C:
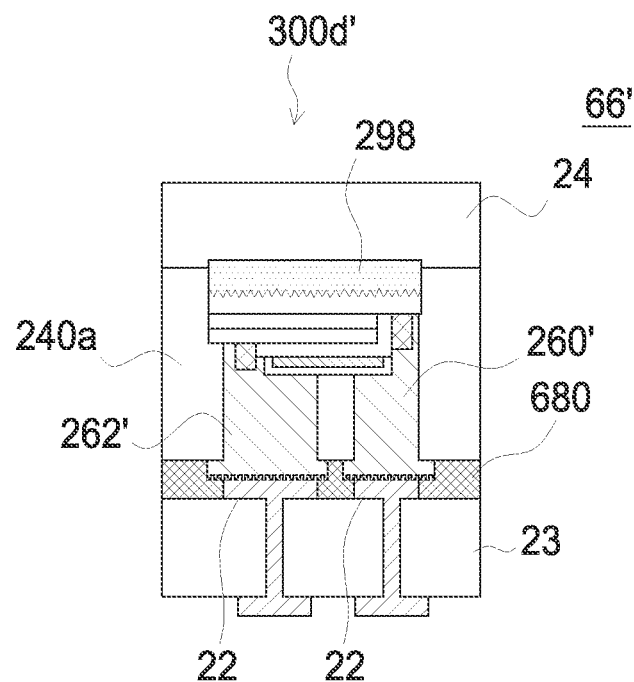
FIG. 6C illustrates a chip-scale LED unit in accordance with another embodiment of the present disclosure.

Similarly, FIG. 6B is a singular form of FIG. 6A. The underfill material 680 and the patterned surface of the metal layers 260' and 262' can be also applied to the foregoing embodiment depicted in FIGS. 5A-5C to form the structure demonstrated in FIG. 6B. The underfill material 680 is filled in the gaps between the LED 300d and the circuit board 23 to enhance the bonding strength and provide a current path. The underfill material 680 comprises an anisotropic conductive film (ACF) that is capable of conducting current in a vertical path between the LED 300d and the circuit board 23, and isolating current in a lateral path parallel to the LED 300d or the circuit board 23. The underfill material 680 is coated on the circuit board 23 prior to bonding the LED array to the circuit board 23. In one embodiment, the first metal layers 260' and the second metal layers 262' does not contact with the metal contacts 22 of the circuit board 23. The underfill material 680 is between the metal layers 260' and 262' and the metal contacts 22 for conducting current between the metal layers 260' and 262' and the metal contacts 22. The metal layers 260' and 262' are patterned to form a plurality of depressions and protrusions on the surface facing the metal contacts 22. Therefore, the contact surface area is increased and the bonding strength is enhanced. The plurality of depressions and protrusions is in a regular form or an irregular form, and the surface roughness Ra is between 0.5 and 5 microns. Similarly, the underfill material 680 and the patterned surface of the metal layers 260' and 262' can also be applied to the foregoing embodiment of FIG. 5E to form the structure demonstrated in FIG. 6C.

Figure 7A:
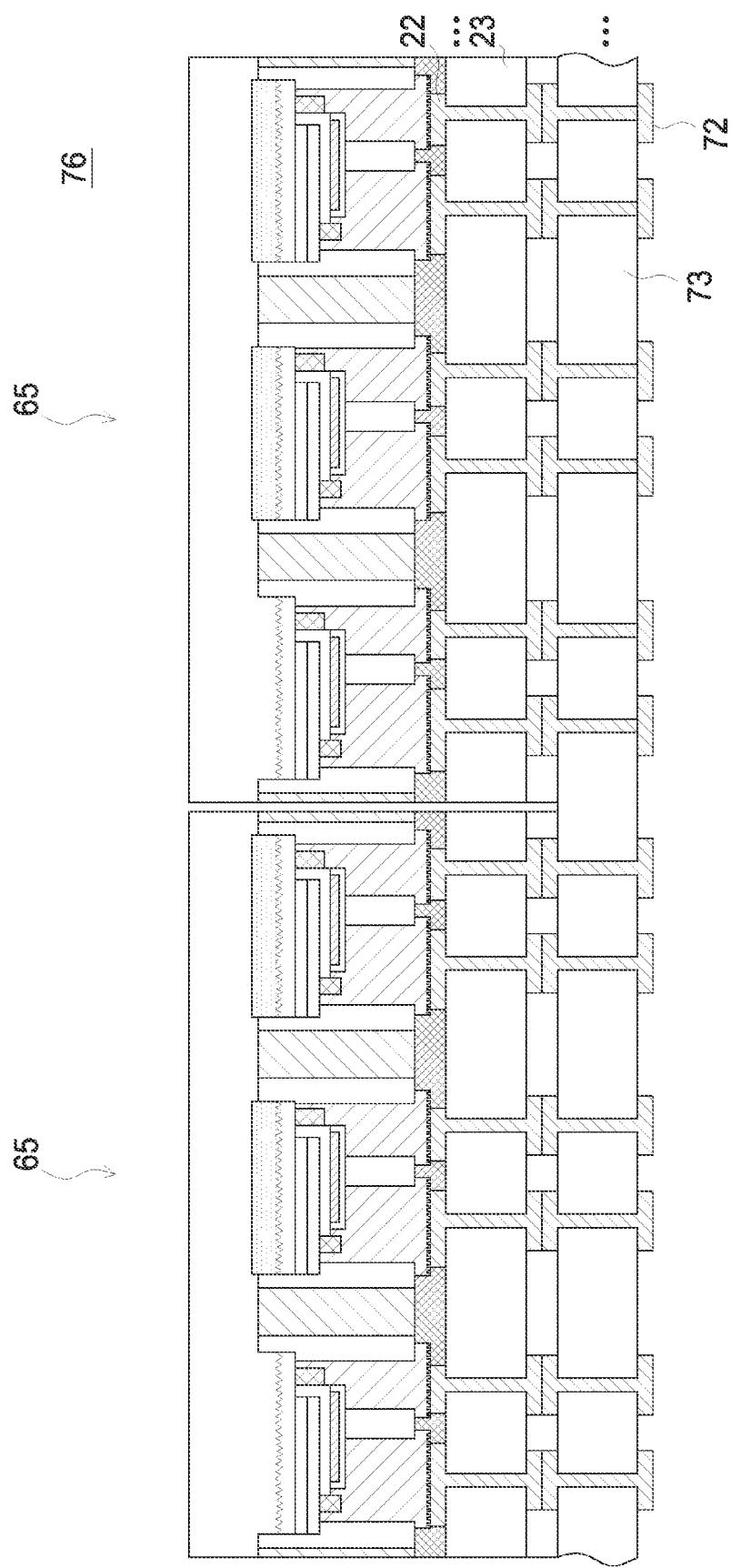
FIG. 7A illustrates a display module in accordance with one embodiment of the present disclosure.

FIG. 7A shows a display module 76 comprises a plurality of chip-scale RGB LED units 65 on a second circuit board 73. The configuration of the chip-scale RGB LED units 65 depends on the pixel size of the display module. For example, any two adjacent chip-scale RGB LED units 65 are either separated from each other by a distance or disposed seamlessly such that they are contacted with each other. The second circuit board comprises circuitry 72 electrically connected to LEDs of the chip-scale RGB LED units 65 for independently controlling the blue, red, and green LEDs in each chip-scale RGB LED unit 65. In one embodiment, the display module 76 contains M rows and N columns of the chip-scale RGB LED units 65 for being used in an display with X*Y pixel resolution, wherein M/N=1/1, 3/2, 4/3 or 16/9; X=a*M, Y=b*N, and a, and b are all positive integers equal to or greater than 2. The display module 76 contains over 500 units of chip-scale RGB LED units 65 in an area of one inch square. Namely, the display module 76 contains over 1500 light-emitting stacks 101 in an area of one inch square. In another embodiment, each chip-scale RGB LED unit comprises a plurality of RGB LED groups and each group comprises one blue LED, one red LED, and one green LED as depicted in the foregoing embodiments. The plurality of RGB LED groups in one chip-scale RGB LED unit is arranged as I×J array, wherein I and J are positive integers, and at least one of I and J are greater than 1. The ratio of I/J is preferably approximately or equal to 1/1, 3/2, 4/3 or 16/9. The distance between two adjacent light-emitting stacks from two adjacent RGB LED groups in one chip-scale RGB LED unit is substantially the same as the distance between two adjacent light-emitting stacks from two adjacent chip-scale RGB LED units. The display module 76 contains M rows and N columns of the chip-scale RGB LED units 65 for being used in an display with X*Y pixel resolution, wherein M/N=1/1, 3/2, 4/3 or 16/9; X=a*M*I, Y=b*N*J, and a, and b are all positive integers equal to or greater than 2. The display module 76 contains over 500 units of RGB LED groups in an area of one inch square. Namely, the display module 76 contains over 1500 light-emitting stacks 101 in an area of one inch square. Each of the LEDs in the RGB LED units and each of the RGB LED units can be independently driven by the circuitry formed on the circuit board 23 and the second circuit board 73. The material of the second circuit board 73 comprises FR-4, BT (Bismaleimide-Triazine) resin, ceramics or glass.

Figure 7B:
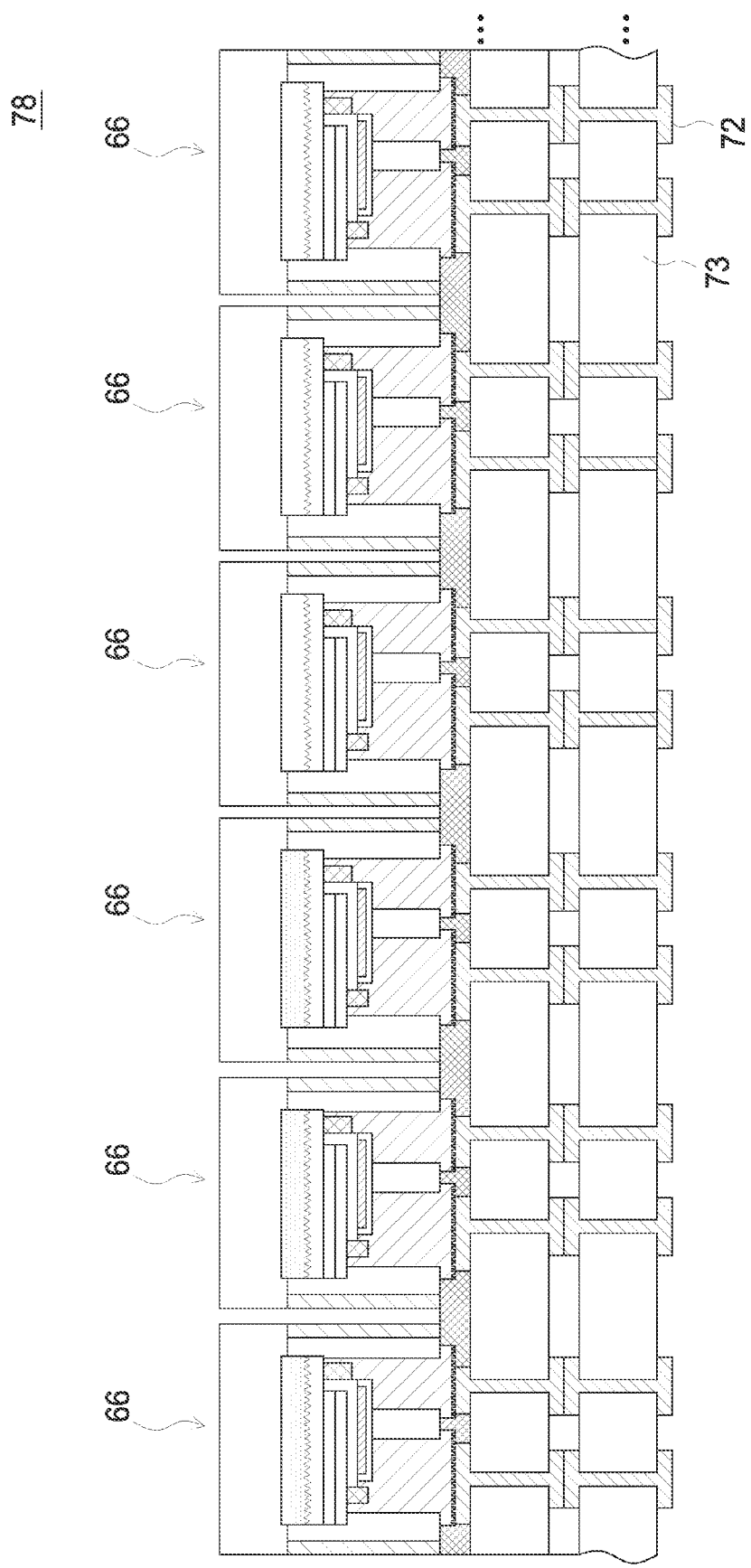
FIG. 7B illustrates a lighting module in accordance with one embodiment of the present disclosure.
Figure 8:
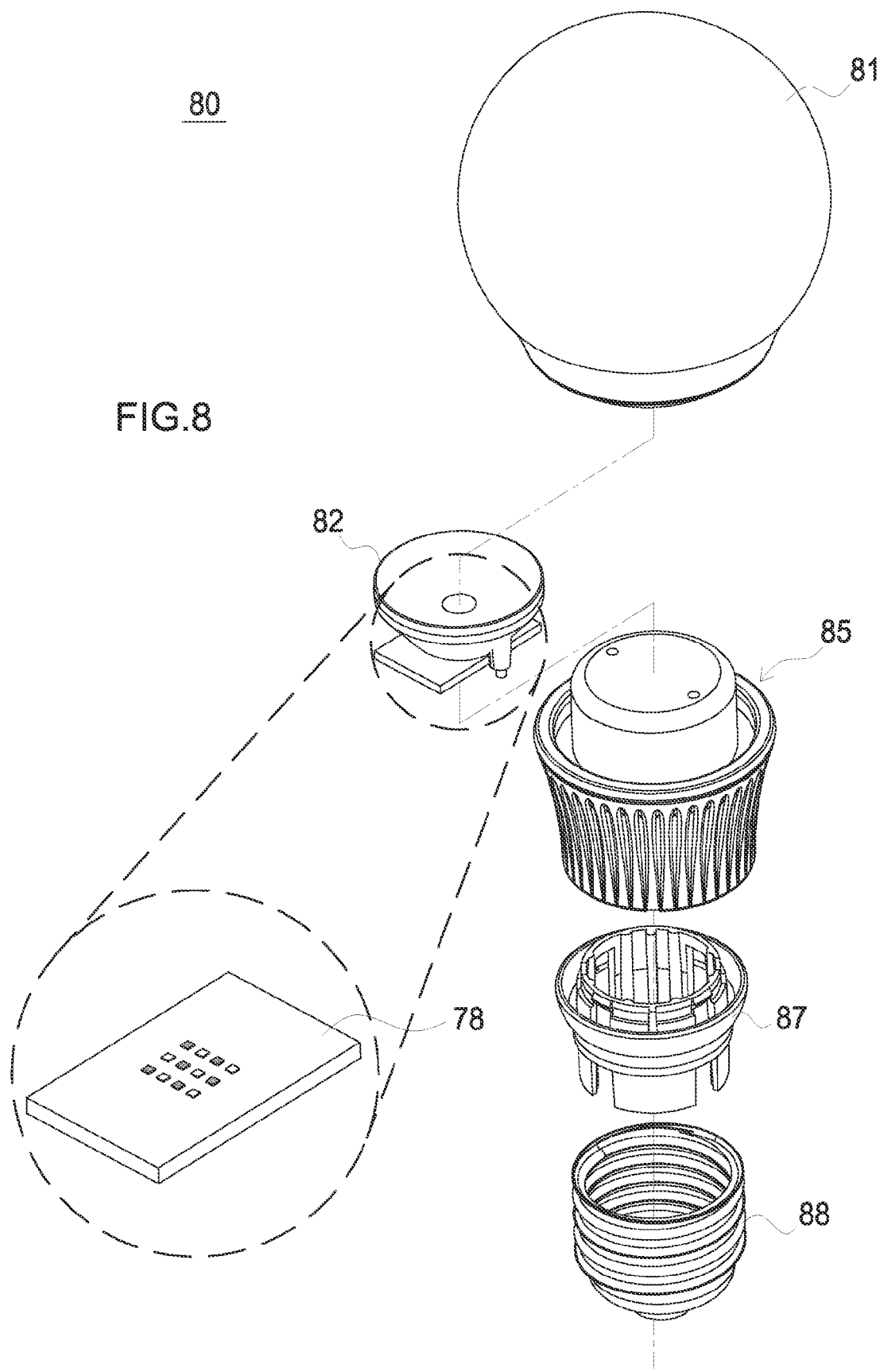
FIG. 8 illustrates a lighting apparatus in accordance with one embodiment of the present disclosure.

FIG. 7B shows a lighting module 78 comprising a plurality of chip-scale LED units 66 on a second circuit board 73. The chip-scale LED units 66 can be connected in series or parallel by the circuit of the second circuit board 73 depending on the driving voltage to be applied. In one embodiment, the lighting module 78 is installed into a lighting bulb 80 as shown in FIG. 8. The lighting bulb further comprises an optical lens 82 covering the lighting module 78, a heat sink 85 having a mounting surface where the lighting module 78 formed thereon, a frame 87 connected to heat sink, and an electrical connector 88 connected to the frame and electrically connected to lighting module.

Although specific embodiments have been illustrated and described, it will be obvious to those skilled in the art that various modifications may be made without departing from what is intended to be limited solely by the appended claims.

What is claimed is:

1. A method for forming a light-emitting apparatus, comprising:
providing a first board having a plurality of first metal contacts;
providing a substrate;
forming a plurality of light-emitting stacks and trenches on the substrate, wherein the light-emitting stacks are apart from each other by the plurality of the trenches;
bonding the light-emitting stacks to the first board;
forming an encapsulating material commonly on the plurality of the light-emitting stacks; and
cutting the first board and the encapsulating material to form a plurality of chip-scale LED units.

2. The method of claim 1, further comprising removing the substrate before forming the encapsulating material.

3. The method of claim 1, further comprising forming a plurality of metal layers on the light-emitting stacks for bonding to the first metal contacts.

4. The method of claim 1, further comprising forming an opaque layer in the trench and enclosing the light-emitting stacks for preventing the light emitted from neighboring light-emitting stacks from mutually interfering or crosstalk.

5. The method of claim 1, further comprising selectively forming a first wavelength converting material on a first light-emitting stack and configured to convert the light emitted from the first light-emitting stack to a first light, wherein the first light-emitting stack is one of the plurality of light-emitting stacks.

6. The method of claim 5, further comprising selectively forming a second wavelength converting material on a second light-emitting stack and configured to convert the light emitted from the second light-emitting stack to a second light, wherein the second light-emitting stack is one of the plurality of light-emitting stacks.

7. The method of claim 6, wherein the plurality of light-emitting stacks comprise a third light-emitting stack devoid of any wavelength converting material formed thereon, wherein the light emitted from the first, second, and third light-emitting stacks is a blue light, and wherein the first light is a green light, and the second light is a red light.

8. The method of claim 1, further comprising an opaque layer formed in the trenches, wherein the encapsulating material is on the trench and the opaque layer.

9. The method of claim 6, further comprising forming a dielectric layer in the trench and between the opaque layer and the light-emitting stacks.

10. The method of claim 3, further comprising patterning the metal layers to form an uneven surface on the metal layers.

11. The method of claim 1, further comprising removing the substrate to expose an exposed surface of the light-emitting stacks after bonding the light-emitting stacks to the first board and roughening the exposed surface of the light-emitting stacks.

12. The method of claim 1, further comprising forming a reflecting layer between the light-emitting stacks and the first board.

13. The method of claim 1, further comprising forming an underfill material substantially over the surface of the first board before bonding the light-emitting stacks to the first metal contacts.

14. The method of claim 13, wherein the underfill material is electrically conductive, and the light-emitting stacks is electrically connected with the first board through the underfill material.

15. The method of claim 1, wherein the first metal contacts extend from a top surface of the first board to a bottom surface of the first board.

16. The method of claim 1, further comprising providing a second board having a plurality of second metal contacts, and bonding the plurality of chip-scale LED units to the second metal contacts of the second board.

17. The method of claim 1, wherein the light-emitting stacks are apart from each other by a distance less than 25 microns.

18. The method of claim 1, wherein one of the chip-scale LED units has an area less than 0.36 mm$^2$.

19. The method of claim 1, wherein one of the chip-scale LED units comprises single light-emitting stack, and the ratio of the area of the chip-scale LED unit to the area of the light-emitting stack is equal to or greater than 9.

20. The method of claim 1, wherein one of the chip-scale LED units comprises a plurality of light-emitting stacks, and the ratio of the area of the chip-scale LED unit to the total area of the light-emitting stacks is smaller than 2.

* * * * *